(12) United States Patent
Ahmed

(10) Patent No.: US 12,155,400 B2
(45) Date of Patent: *Nov. 26, 2024

(54) DATA COMPRESSION METHOD, DATA COMPRESSION APPARATUS, DATA DECOMPRESSION METHOD, DATA DECOMPRESSION APPARATUS AND DATA STORAGE SYSTEM

(71) Applicant: Preferred Networks, Inc., Tokyo (JP)

(72) Inventor: Tanvir Ahmed, Tokyo (JP)

(73) Assignee: Preferred Networks, Inc., Tokyo (JP)

( * ) Notice: Subject to any disclaimer, the term of this patent is extended or adjusted under 35 U.S.C. 154(b) by 21 days.

This patent is subject to a terminal disclaimer.

(21) Appl. No.: 17/805,936

(22) Filed: Jun. 8, 2022

(65) Prior Publication Data

US 2022/0302926 A1    Sep. 22, 2022

Related U.S. Application Data

(63) Continuation of application No. 16/838,343, filed on Apr. 2, 2020, now Pat. No. 11,387,844.

(Continued)

(51) Int. Cl.
*H03M 7/00* (2006.01)
*G06F 7/24* (2006.01)
(Continued)

(52) U.S. Cl.
CPC ............ *H03M 7/3059* (2013.01); *G06F 7/24* (2013.01); *G06F 9/30032* (2013.01);
(Continued)

(58) Field of Classification Search
CPC .... H03M 7/3088; H03M 7/3086; H03M 7/30; H03M 7/3084; H03M 7/40; H03M 7/42; H03M 7/46; H03M 13/09; H03M 7/3091; H03M 7/6005; H03M 7/6011; H03M 7/6017; H03M 7/4006; H03M 7/4037; H03M 7/4093; H03M 7/425; H03M 7/6029; G06F 3/0608; G06F 2212/401; G06F 3/0673; G06F 12/023; G06F 16/1744; G06F 16/86; G06F 11/073; G06F 11/1666; G06F 12/00; G06F 12/08; G06F 3/0641; G06F 3/0644; G06F 40/146; G06F 40/242; G06F 9/3818
(Continued)

(56) References Cited

U.S. PATENT DOCUMENTS 5,680,601 A    10/1997  Rust
5,951,623 A    9/1999   Reynar et al.
(Continued)

*Primary Examiner* — Linh V Nguyen
(74) *Attorney, Agent, or Firm* — IPUSA, PLLC

(57) ABSTRACT

A data processing method includes: acquiring, by one or more processors, compressed data generated from data, wherein values of the compressed data are stored at first storage locations, values of the data are stored at second storage locations; acquiring, by the one or more processors, index data includes indices indicative of the first storage locations; acquiring, by the one or more processors, at least two packed indices from the index data, the at least two packed indices being generated from the index data; and inputting, by the one or more processors, the at least two packed indices into at least two selectors.

20 Claims, 18 Drawing Sheets

Related U.S. Application Data

(60) Provisional application No. 62/836,162, filed on Apr. 19, 2019.

(51) Int. Cl.
  *G06F 9/30* (2018.01)
  *H03M 7/30* (2006.01)

(52) U.S. Cl.
  CPC ...... *G06F 9/30145* (2013.01); *H03M 7/3077* (2013.01); *H03M 7/3082* (2013.01)

(58) Field of Classification Search
  USPC ..................................... 341/106, 107, 87, 65
  See application file for complete search history.

(56) References Cited

U.S. PATENT DOCUMENTS

| | | | |
|---|---|---|---|
| 6,055,526 A * | 4/2000 | Ambroziak | G06F 16/328 |
| | | | 707/999.102 |
| 6,563,956 B1 * | 5/2003 | Satoh | H03M 7/3084 |
| | | | 382/229 |
| 7,921,088 B1 * | 4/2011 | Mittal | G06F 16/9027 |
| | | | 707/693 |
| 7,953,881 B1 | 5/2011 | Vadlakonda et al. | |
| 9,214,954 B2 | 12/2015 | Ogasawara et al. | |
| 9,419,648 B1 | 8/2016 | Guilford et al. | |
| 9,793,920 B1 | 10/2017 | Kataoka et al. | |
| 9,973,206 B2 * | 5/2018 | Kataoka | H03M 7/3091 |
| 11,387,844 B2 * | 7/2022 | Ahmed | G06F 9/30032 |
| 2004/0090351 A1 | 5/2004 | Wu et al. | |
| 2005/0210151 A1 * | 9/2005 | Abdo | H03M 7/3086 |
| | | | 709/247 |
| 2009/0058693 A1 | 3/2009 | Laker et al. | |
| 2013/0031337 A1 * | 1/2013 | Larin | G06F 9/3853 |
| | | | 712/226 |
| 2013/0054546 A1 * | 2/2013 | Solihin | G06F 12/0223 |
| | | | 707/693 |
| 2013/0198152 A1 * | 8/2013 | McGhee | H03M 7/3088 |
| | | | 707/693 |
| 2013/0238865 A1 * | 9/2013 | Kataoka | H03M 7/4031 |
| | | | 711/154 |
| 2016/0085555 A1 * | 3/2016 | Gopal | H03M 7/3091 |
| | | | 711/125 |
| 2017/0041021 A1 | 2/2017 | Karkkainen et al. | |
| 2019/0379393 A1 | 12/2019 | Wu | |

\* cited by examiner

INITIAL STATE

CYCLE 0

CYCLE 7

CYCLE 8

DATA COMPRESSION METHOD, DATA COMPRESSION APPARATUS, DATA DECOMPRESSION METHOD, DATA DECOMPRESSION APPARATUS AND DATA STORAGE SYSTEM

CROSS-REFERENCE TO RELATED APPLICATIONS

The present application is a continuation of patent application Ser. No. 16/838,343 filed on Apr. 2, 2020, which is based on and claims priority to U.S. provisional application No. 62/836,162 filed on Apr. 19, 2019 with the USPTO, the entire contents of which are hereby incorporated by reference.

BACKGROUND

1. Technical Field

The present disclosure relates to a data compression method, a data compression apparatus, a data decompression method, a data decompression apparatus and a data storage system.

2. Description of the Related Art

Sparse data may be filled with a large number of zeros, and such redundant data may cause a large overhead.

Several sparse data compression schemes have been proposed. As one conventional sparse data compression scheme, Compressed Sparse Row (CSR) can be often used to compress sparse data in a matrix.

SUMMARY

In light of the above problem, one objective of the present disclosure is to provide a novel data compression and decompression technique for sparse and redundant data.

One aspect of the present disclosure relates to a data compression method comprising: generating, by one or more processors, compressed data from data, wherein the compressed data includes one or more unduplicated values of the data; and generating, by the one or more processors, index data from the data, wherein the index data includes indices indicative of storage locations for the unduplicated values.

Another aspect of the present disclosure relates to a data decompression method comprising: acquiring, by one or more processors, compressed data and index data for data, wherein the compressed data includes one or more unduplicated values of the data, and the index data includes indices indicative of storage locations for the unduplicated values; and restoring, by the one or more processors, the data from the compressed data and the index data.

BRIEF DESCRIPTION OF THE DRAWINGS

Other objects and further features of the present disclosure will be apparent from the following detailed description when read in conjunction with the accompanying drawings, in which.

DETAILED DESCRIPTION

Embodiments of the present disclosure are described below with reference to the drawings.

Overview of Present Disclosure

Upon receiving incoming data, for example, sparse data including redundant elements, a data compression apparatus according to embodiments of the present disclosure generates compressed data and index data from the data and stores the compressed data and the index data in a compressed memory and an index memory, respectively, instead of storing the incoming data without compression. The compressed data includes one or more unduplicated or non-redundant values of the incoming data, and the index data includes indices indicative of storage locations in the compressed memory for respective elements in the incoming data. Typically, the incoming data may be formed of a sequence of data elements such as vector data, matrix data, array data, linked data or the like.

Then, upon receiving a request for the incoming data, a data decompression apparatus corresponding to the data compression apparatus accesses the compressed memory and the index memory to acquire the compressed data and the index data, respectively, and restores the data from the compressed data and the index data through shift and mask operations as described in detail below.

In this fashion, the sparse data including redundant elements can be compressed and decompressed in a lossless manner, and the incoming data can be stored in a smaller data amount in form of the compressed data and the index data.

Therefore, data for use in a convolution neural network, a social graph, image or signal processing or the like which may be highly sparse and redundant can be efficiently stored with the present compression and decompression scheme.

Data Storage System

Figure 1:
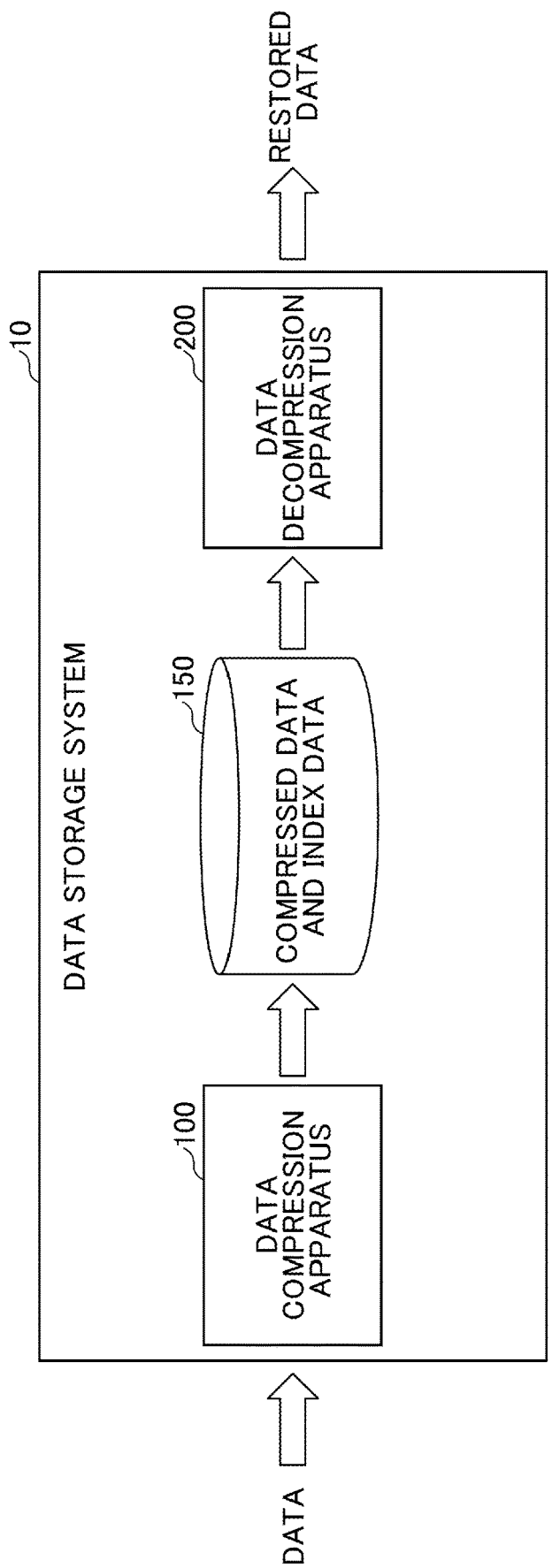
FIG. 1 is a schematic view that depicts a data storage system according to one embodiment of the present disclosure.

First, a data storage system according to one embodiment of the present disclosure is described with reference to FIGS. 1 to 3. FIG. 1 is a schematic view of a data storage system according to one embodiment of the present disclosure.

As illustrated in FIG. 1, upon receiving incoming data, typically sparse data including redundant elements, a data storage system 10 generates compressed data and index data from the received data and stores the compressed data and the index data in a compressed memory and an index memory, respectively, instead of storing the uncompressed incoming data. After storing the compressed data and the index data, upon receiving a request for the data, the data storage system 10 restores the data from the compressed data and the index data in a lossless manner as described in detail below.

The data storage system 10 includes a data compression apparatus 100, a storage device 150 and a data decompression apparatus 200.

The data compression apparatus 100 generates compressed data and index data from incoming data. Specifically, the data compression apparatus 100 identifies duplicated or redundant values in elements in the incoming data, aggregates the identified duplicated or redundant values into a single unduplicated or non-redundant value, and stores only the unduplicated or non-redundant values as compressed data in a compressed memory in the storage device 150.

Figure 2:
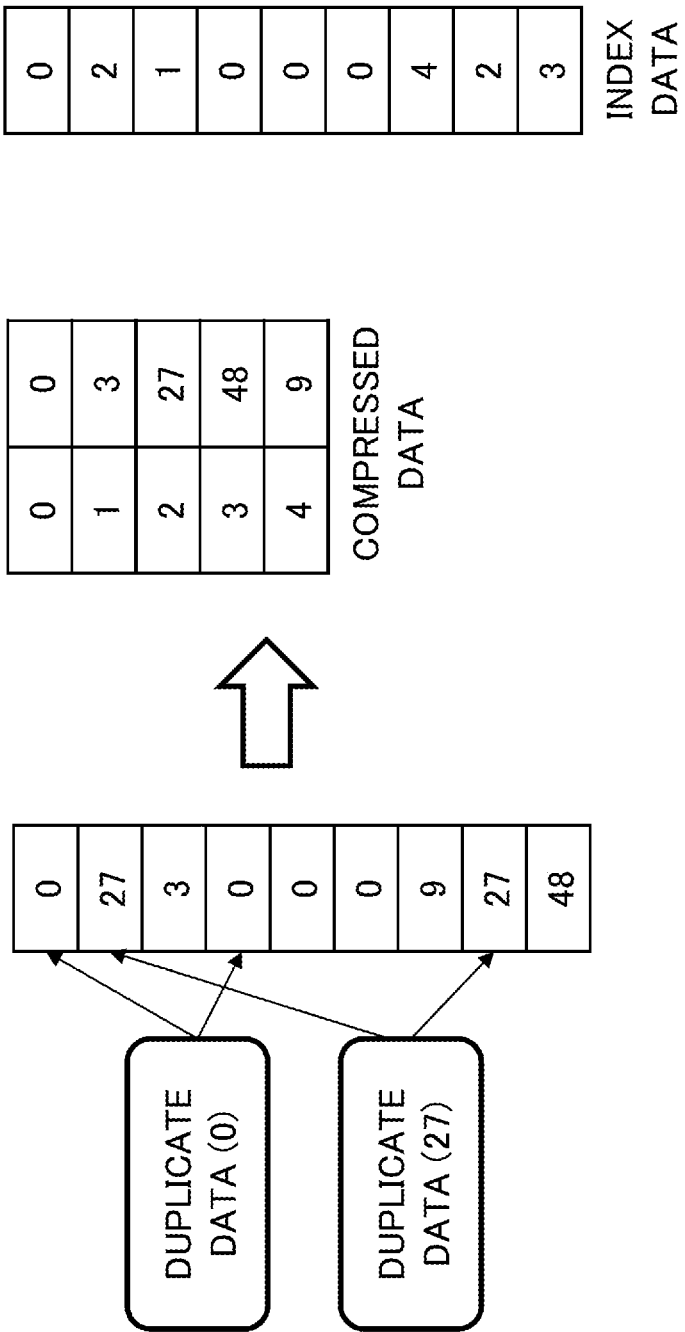
FIG. 2 is a schematic view that depicts one exemplary data compression scheme according to one embodiment of the present disclosure.

For example, upon receiving vector data as illustrated in FIG. 2, the data compression apparatus 100 detects duplicated elements "0" and "27" from the received vector data and generates compressed data formed of only unduplicated elements "0", "3", "27", "48" and "9" by aggregating four "0"s into the single unduplicated value "0" and two "27"s into the single duplicated value "27".

Also, the data compression apparatus 100 generates index data formed of indices indicative of storage locations in the compressed memory that store values corresponding to the respective elements in the incoming data.

In the illustrated example, the value "0" at the first row in the incoming data is stored at storage location 0 in the compressed memory, and accordingly the index memory has an index "0" indicative of storage location 0 at its first row.

Also, the value "27" at the second row in the incoming data is stored at storage location 2 in the compressed memory, and accordingly the index memory has an index "2" indicative of storage location 2 at its second row.

Also, the value "3" at the third row in the incoming data is stored at storage location 1 in the compressed memory, and accordingly the index memory has an index "1" indicative of storage location 1 at its third row.

Also, the value "0" at the fourth to sixth rows in the incoming data is stored at storage location 0 in the compressed memory, and accordingly the index memory has an index "0" indicative of storage location 0 at its forth to sixth rows.

Also, the value "9" at the seventh row in the incoming data is stored at storage location 4 in the compressed memory, and accordingly the index memory has an index "4" indicative of storage location 4 at its seventh row.

Also, the value "27" at the eighth row in the incoming data is stored at storage location 2 in the compressed memory, and accordingly the index memory has an index "2" indicative of storage location 2 at its eighth row.

Finally, the value "48" at the ninth row in the incoming data is stored at storage location 3 in the compressed memory, and accordingly the index memory has an index "3" indicative of storage location 43 at its ninth row. In this fashion, the indices indicative of the respective storage locations in the compressed memory are arranged in the index memory as illustrated.

The storage device 150 stores the compressed data and the index data provided from the data compression apparatus 100. In the illustrated embodiment, the storage device 150 is arranged as a standalone device separate from the data compression apparatus 100 or the data decompression apparatus 200. However, the storage device 150 according to the present disclosure is not limited to the illustrated arrangement and may be accommodated in one or both of the data compression apparatus 100 and the data decompression apparatus 200 depending on implementations.

The data decompression apparatus 200 accesses the storage device 150 to acquire the compressed data and the index data and restores the incoming data provided to the data storage system 10 from the compressed data and the index data.

Figure 3:
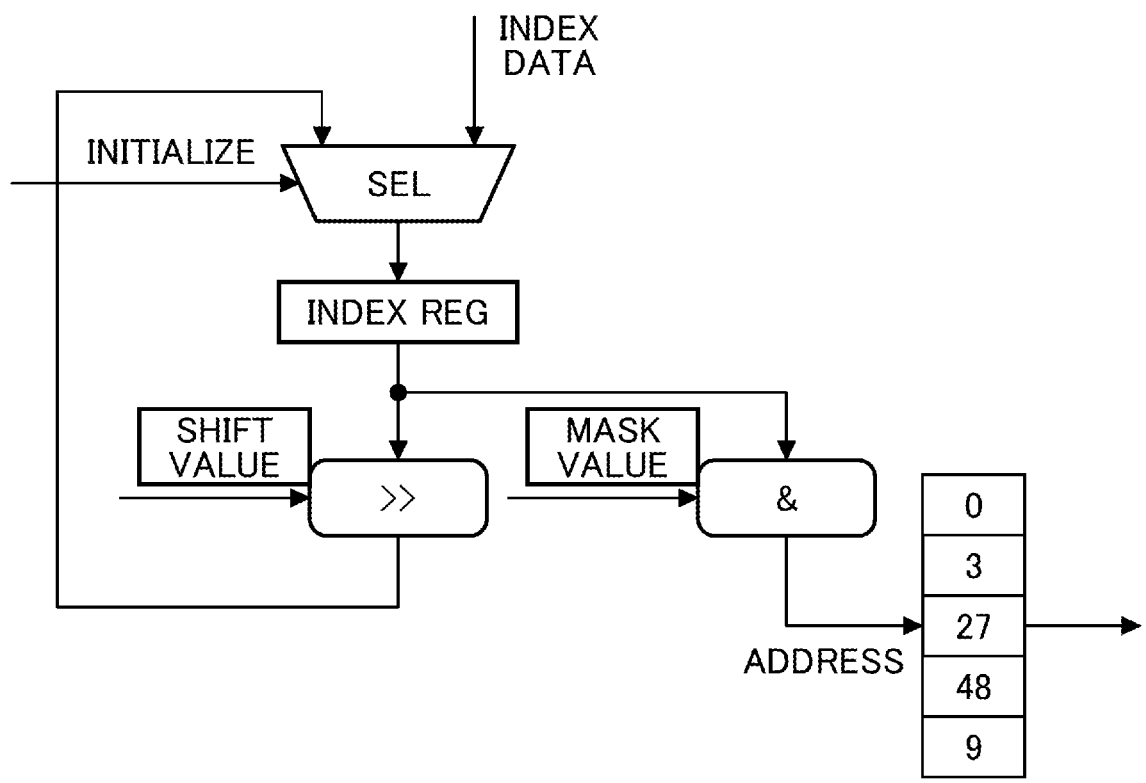
FIG. 3 is a schematic circuit diagram of one exemplary circuit device that implements data decompression according to one embodiment of the present disclosure.

In one example, the data decompression apparatus 200 may use a circuit device having an architecture as illustrated in FIG. 3 to determine respective elements in the incoming data one-by-one based on the compressed data and the index data.

Specifically, upon receiving the compressed data and the index data from the storage device 150, the data decompression apparatus 200 may perform a shift operation with a predetermined shift value and a mask operation with a predetermined mask value on the received index data to determine addresses indicative of storage locations in the compressed memory that store unduplicated values corresponding to respective elements in the index data and then output values corresponding to the determined addresses. Upon determining the values for all the elements in the index data, the data decompression apparatus 200 can restore the incoming data from the determined values.

Data Compression Apparatus

Figure 4:
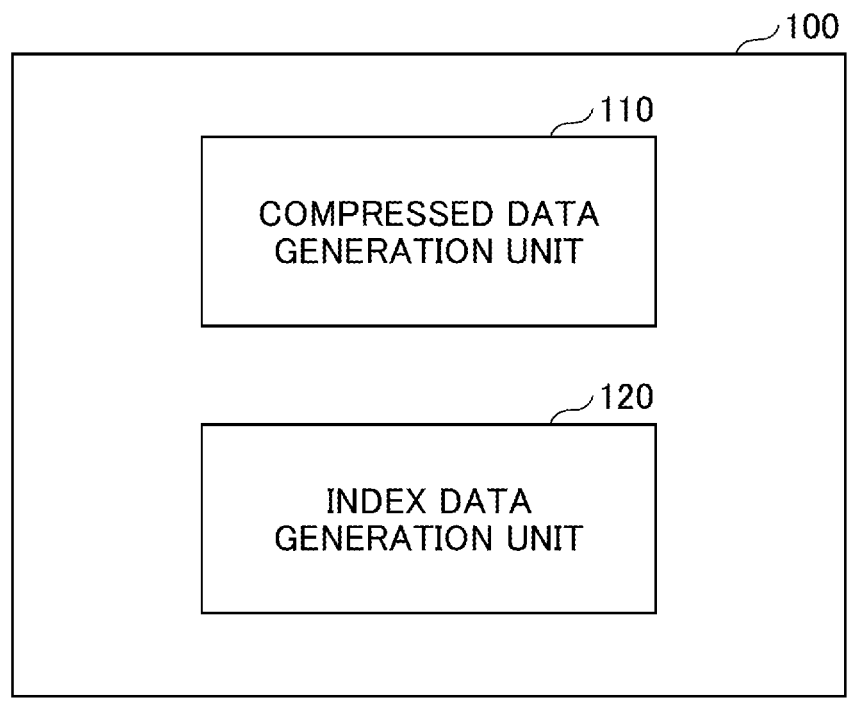
FIG. 4 is a block diagram of a functional arrangement of a data compression apparatus according to one embodiment of the present disclosure.

Next, a data compression apparatus according to one embodiment of the present disclosure is described with reference to FIGS. 4 and 5. FIG. 4 is a block diagram of a functional arrangement of a data compression apparatus according to one embodiment of the present disclosure.

As illustrated in FIG. 4, the data compression apparatus 100 includes a compressed data generation unit 110 and an index data generation unit 120.

The compressed data generation unit 110 generates compressed data from data, and the compressed data includes one or more unduplicated values of the data. Specifically, upon receiving incoming data, which may be composed of a sequence of elements such as vector data, matrix data, array data, linked data or the like, the compressed data generation unit 110 determines whether the incoming data includes duplicated or redundant values for respective elements in the incoming data. If so, the compressed data generation unit 110 aggregates the duplicated or redundant values into a single unduplicated or non-redundant value and stores only the unduplicated or non-redundant values as compressed data in a compressed memory.

Figure 5:
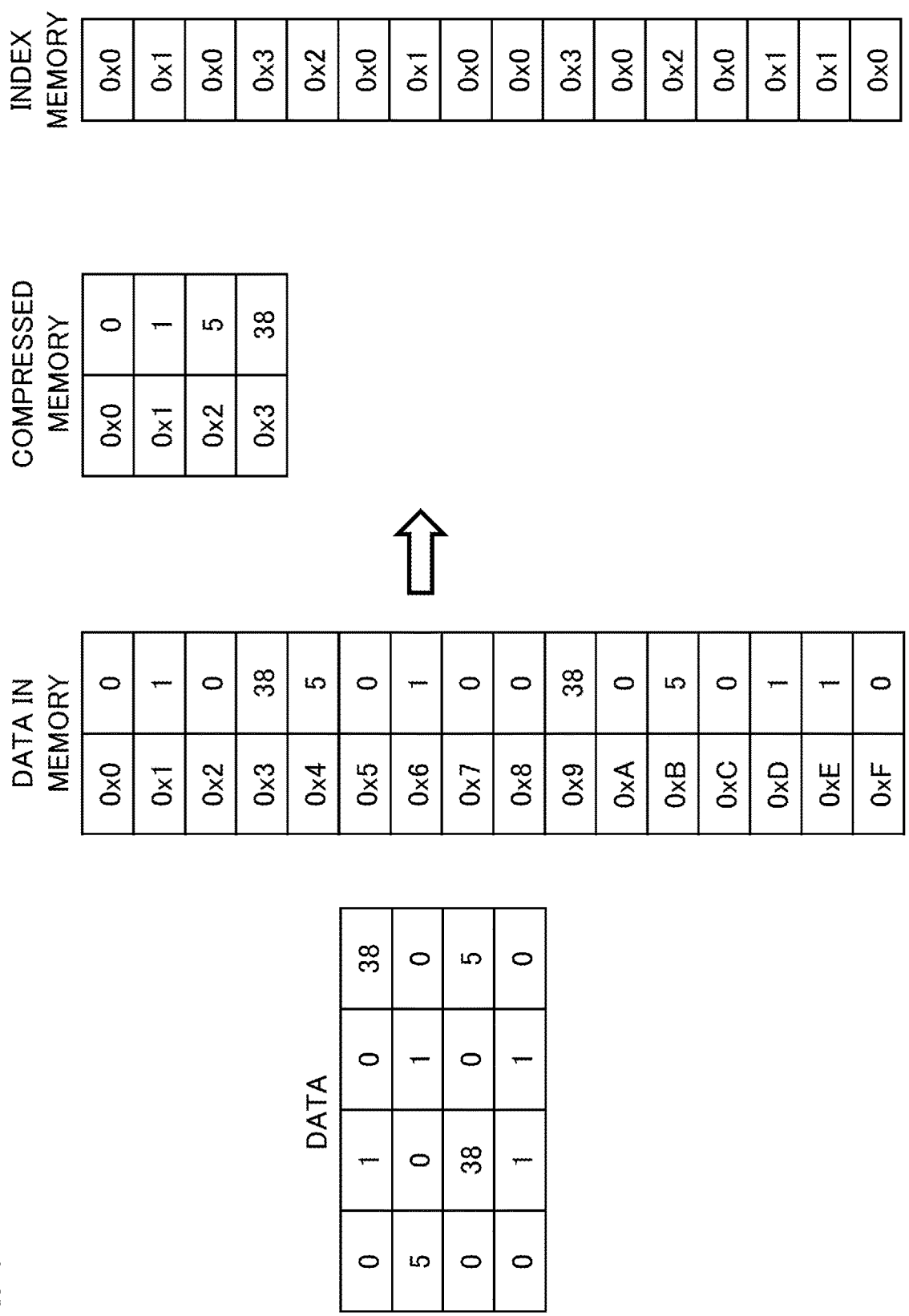
FIG. 5 is a schematic view that depicts exemplary data compression into a compressed memory and an index memory according to one embodiment of the present disclosure.

For example, if the compressed data generation unit 110 acquires incoming matrix data as illustrated in FIG. 5, the compressed data generation unit 110 temporarily stores 16 elements "0", "1", "0", "38", "5", "0", "1", "0", "0", "38", "0", "5", "0", "1", "1", "0" in the matrix data in storage locations 0x0, 0x1, 0x2, 0x3, 0x4, 0x5, 0x6, 0x7, 0x8, 0x9, 0xA, 0xB, 0xC, 0xD, 0xE, 0xF, respectively, for subsequent processing. Then, the compressed data generation unit 110 identifies four unduplicated values "0", "1", "5", "38" from the stored elements and stores only the identified unduplicated values "0", "1", "5", "38" as compressed data at storage locations 0x0, 0x1, 0x2, 0x3, respectively, in a compressed memory. In this manner, the 16 elements in the incoming matrix data including duplicated or redundant values can be reduced to four unduplicated values.

The index data generation unit 120 generates index data from the data, and the index data includes indices indicative of storage locations for the unduplicated values. Specifically, the index data generation unit 120 determines at which storage locations in the compressed memory values of respective elements in the incoming data are stored and stores indices indicative of the determined storage locations in the corresponding elements in the index memory.

In the example as illustrated in FIG. 5, the index data generation unit 120 determines that the value "0" of the first element in the incoming data is stored in storage location 0x0 in the compressed memory and accordingly stores the index 0x0 in the first element in the index memory.

Then, the index data generation unit 120 determines that the value "1" in the second element in the incoming data is stored in storage location 0x1 in the compressed memory and accordingly stores the index 0x1 in the second element in the index memory.

Also, the index data generation unit 120 determines that the value "0" of the third element in the incoming data is stored in storage location 0x0 in the compressed memory and accordingly stores the index 0x0 in the third element in the index memory.

Also, the index data generation unit 120 determines that the value "38" of the fourth element in the incoming data is stored in storage location 0x3 in the compressed memory and accordingly stores the index 0x3 in the fourth element in the index memory.

Also, the index data generation unit 120 determines that the value "5" of the fifth element in the incoming data is stored in storage location 0x2 in the compressed memory and accordingly stores the index 0x2 in the fifth element in the index memory.

Also, the index data generation unit 120 determines that the value "0" of the sixth element in the incoming data is stored in storage location 0x0 in the compressed memory and accordingly stores the index 0x0 in the sixth element in the index memory.

Also, the index data generation unit 120 determines that the value "1" of the seventh element in the incoming data is stored in storage location 0x1 in the compressed memory and accordingly stores the index 0x1 in the seventh element in the index memory.

Also, the index data generation unit 120 determines that the value "0" of the eighth element in the incoming data is stored in storage location 0x0 in the compressed memory and accordingly stores the index 0x0 in the eighth element in the index memory.

Also, the index data generation unit 120 determines that the value "0" of the ninth element in the incoming data is stored in storage location 0x0 in the compressed memory and accordingly stores the index 0x0 in the ninth element in the index memory.

Also, the index data generation unit 120 determines that the value "38" of the tenth element in the incoming data is stored in storage location 0x3 in the compressed memory and accordingly stores the index 0x3 in the tenth element in the index memory.

Also, the index data generation unit 120 determines that the value "0" of the eleventh element in the incoming data is stored in storage location 0x0 in the compressed memory and accordingly stores the index 0x0 in the eleventh element in the index memory.

Also, the index data generation unit 120 determines that the value "5" of the twelfth element in the incoming data is stored in storage location 0x2 in the compressed memory and accordingly stores the index 0x2 in the twelfth element in the index memory.

Also, the index data generation unit 120 determines that the value "0" of the thirteenth element in the incoming data is stored in storage location 0x0 in the compressed memory and accordingly stores the index 0x0 in the thirteenth element in the index memory.

Also, the index data generation unit 120 determines that the value "1" of the fourteenth element in the incoming data is stored in storage location 0x1 in the compressed memory and accordingly stores the index 0x1 in the fourteenth element in the index memory.

Also, the index data generation unit 120 determines that the value "1" of the fifteenth element in the incoming data is stored in storage location 0x1 in the compressed memory and accordingly stores the index 0x1 in the fifteenth element in the index memory.

Also, the index data generation unit 120 determines that the value "0" of the sixteenth element in the incoming data is stored in storage location 0x0 in the compressed memory and accordingly stores the index 0x0 in the sixteenth element in the index memory.

In this fashion, the index data generation unit 120 can generate the index data having a sequence of 16 indices "0x0", "0x1", "0x0", "0x3", "0x2", "0x0", "0x1", "0x0", "0x0", "0x3", "0x0", "0x2", "0x0", "0x1", "0x1", "0x0".

After generating the compressed data and the index data, the compressed data generation unit 110 and the index data generation unit 120 may store the generated compressed data in the compressed memory and the generated index data in the index memory. In this manner, the compressed data and the index data, the total data amount of which may be typically smaller than the incoming data, can be stored instead of the incoming uncompressed data. Particularly in the case where the incoming data has a relatively large number of duplicated and redundant values, the compression efficiency could be higher, which can cause effectiveness of storage saving to be greater.

In one embodiment, the compressed data generation unit 110 may sort the one or more unduplicated values in an ascending order and store the sorted unduplicated values in the storage locations in the compressed memory. In the example as illustrated in FIG. 5, if the compressed data generation unit 110 searches for unduplicated values from the incoming data in the ascending order from the first storage location 0x0 to the last storage location 0xF, the compressed data generation unit 110 might detect unduplicated values "0", "1", "38", "5" in this order. According to this embodiment, the compressed data generation unit 110 may sort the detected unduplicated values in the ascending order and store the unduplicated values "0", "1", "5", "38" in this order in the corresponding storage locations in the compressed memory.

Data Decompression Apparatus

Figure 6:
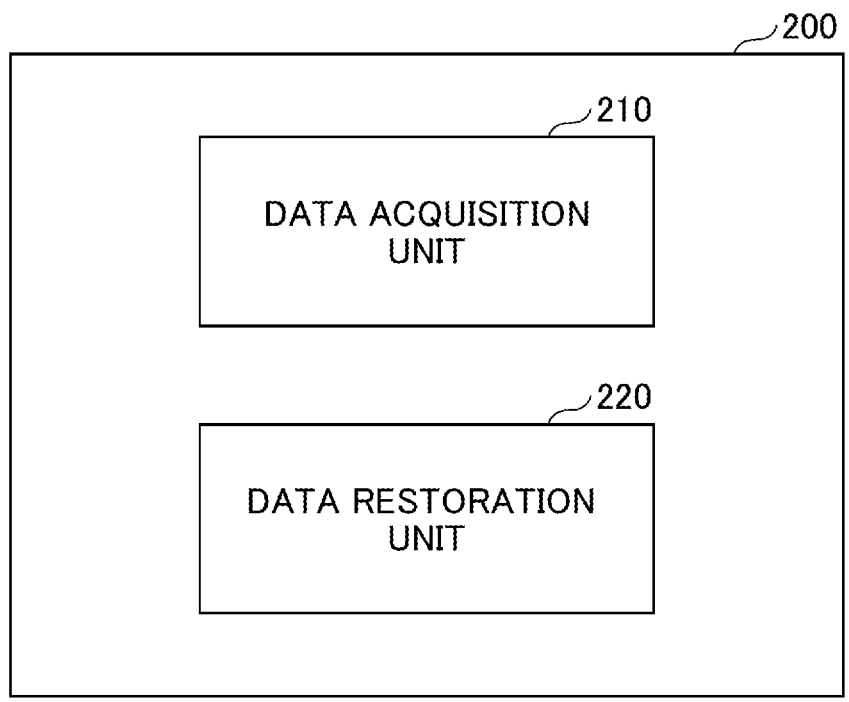
FIG. 6 is a block diagram of a functional arrangement of a data decompression apparatus according to one embodiment of the present disclosure.

Next, a data decompression apparatus according to one embodiment of the present disclosure is described with reference to FIGS. 6 to 17. FIG. 6 is a block diagram of a functional arrangement of a data decompression apparatus according to one embodiment of the present disclosure.

As illustrated in FIG. 6, the data decompression apparatus 200 includes a data acquisition unit 210 and a data restoration unit 220.

The data acquisition unit 210 acquires a compressed data and an index data for data. As stated above, the compressed data and the index data are generated by the data compression apparatus 100 from the incoming data, and the data acquisition unit 210 accesses the compressed memory and the index memory in the storage device 150 to acquire the compressed data and the index data, respectively. Note that the compressed data includes one or more unduplicated values of the data, and the index data includes indices indicative of storage locations for the unduplicated values, as stated above.

The data restoration unit 220 restores the data from the compressed data and the index data. Specifically, the data restoration unit 220 identifies indices for respective elements in the index memory and determines values in storage locations in the compressed memory corresponding to the identified indices.

In one implementation, the data restoration unit 220 may include a circuit device as stated above with reference to FIG. 3. The data restoration unit 220 may generate several packed indices from index data by dividing the index data into a sequence of indices having a predetermined length and input the generated packed indices to the circuit device sequentially.

Figure 7:
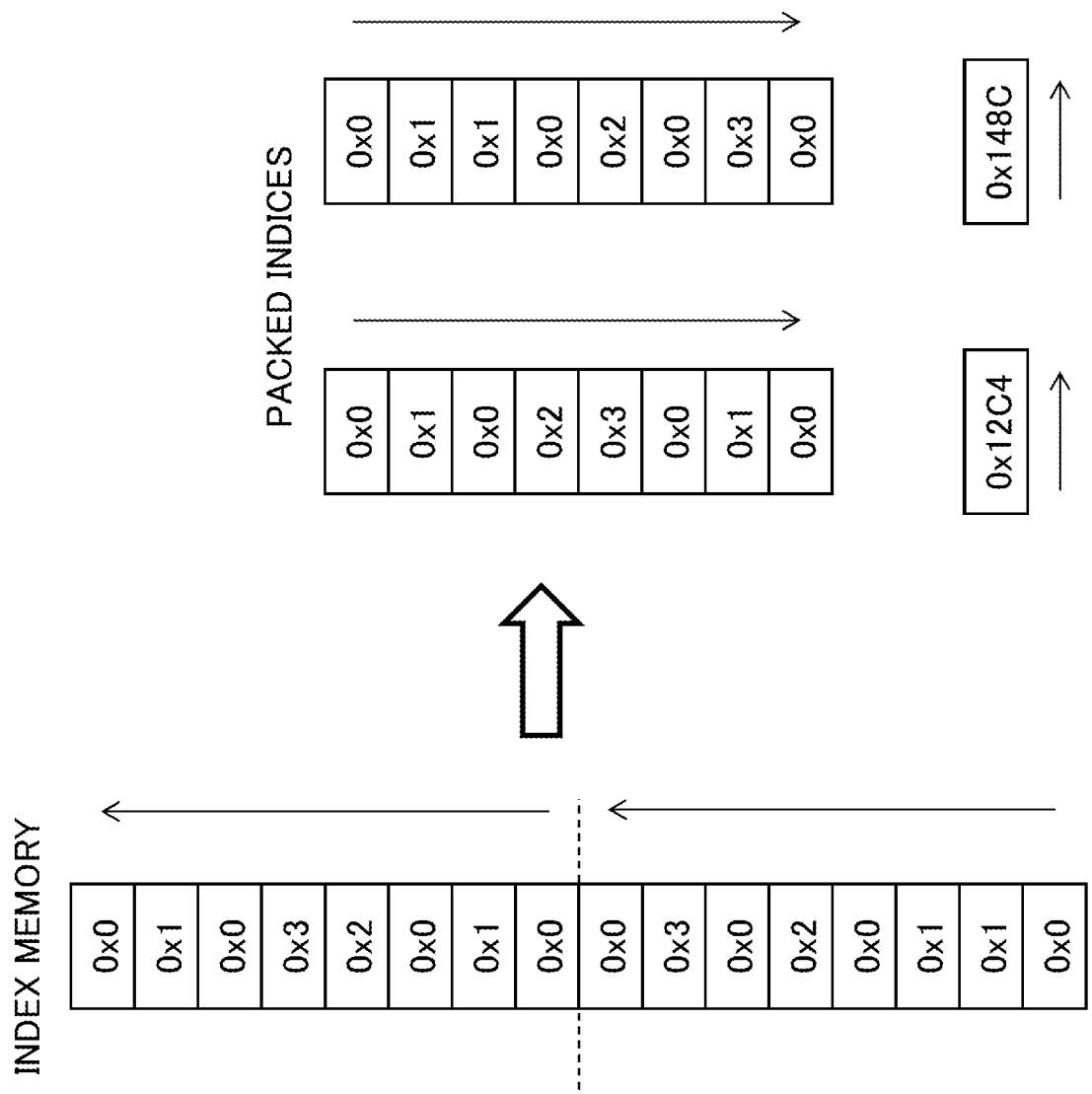
FIG. 7 is a schematic view that depicts exemplary data packing into packed indices according to one embodiment of the present disclosure.

In the example as illustrated in FIG. 7, the index data "0x0 0x1 0x0 0x3 0x2 0x0 0x1 0x0 0x0 0x3 0x0 0x2 0x0 0x1 0x1 0x0" may be divided into two sequences of packed indices "0x0 0x1 0x0 0x2 0x3 0x0 0x1 0x0" and "0x0 0x1 0x1 0x0 0x2 0x0 0x3 0x0". The two sequences of packed indices "0x0 0x1 0x0 0x2 0x3 0x0 0x1 0x0" and "0x0 0x1 0x1 0x0 0x2 0x0 0x3 0x0" may be represented as "0x12C4" and "0x148C", respectively, in hexadecimal representation. However, the generation of such packed indices is not limited to the above two-division, and the packed indices may be generated in any other appropriate manner.

Upon receiving the incoming packed indices, the circuit device may store the packed indices in an index register and perform a shift operation with a predetermined shift value and a mask operation with a predetermined mask value on the packed indices in the index register. As can be seen in the circuit diagram, the shifted packed indices are stored in the index register for the next operation, and the mask operation results in an address for a pointer for use in reading values from the compressed memory. When the address for the pointer has been determined, the circuit device reads and outputs an unduplicated value from a storage location indicated by the determined address and repeats the above operations on the shifted packed indices in the index register.

Figure 8:
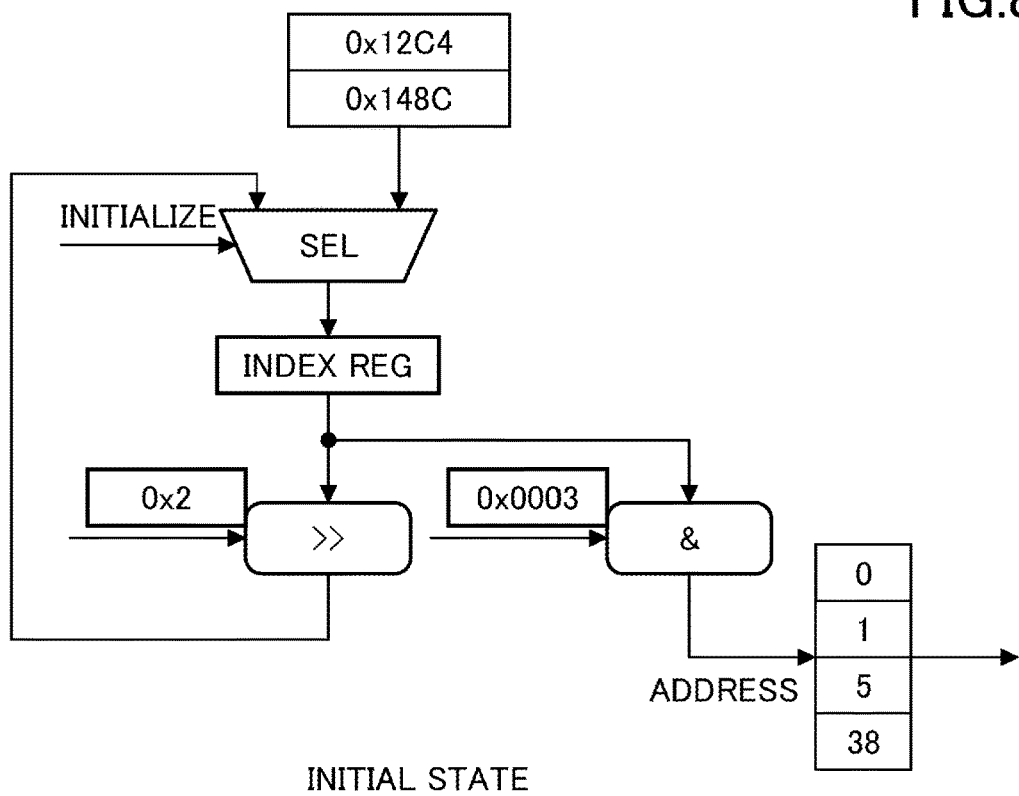
FIG. 8 is a schematic circuit diagram of one exemplary circuit device at an initial state that implements data decompression according to one embodiment of the present disclosure.

More specifically, as illustrated in FIG. 8, the data restoration unit 220 initializes the circuit device with an INITIALIZE signal and provides the two sequences of packed indices "0x12C4" and "0x148C" and the compressed data "0", "1", "5", "38" to the circuit device. Also in the illustrated embodiment, the shift value and the mask value are preset to "0x2" and "0x0003", respectively. Note that the shift value and the mask value are not limited to these values and may be set to any other appropriate values depending on implementations.

Figure 9:
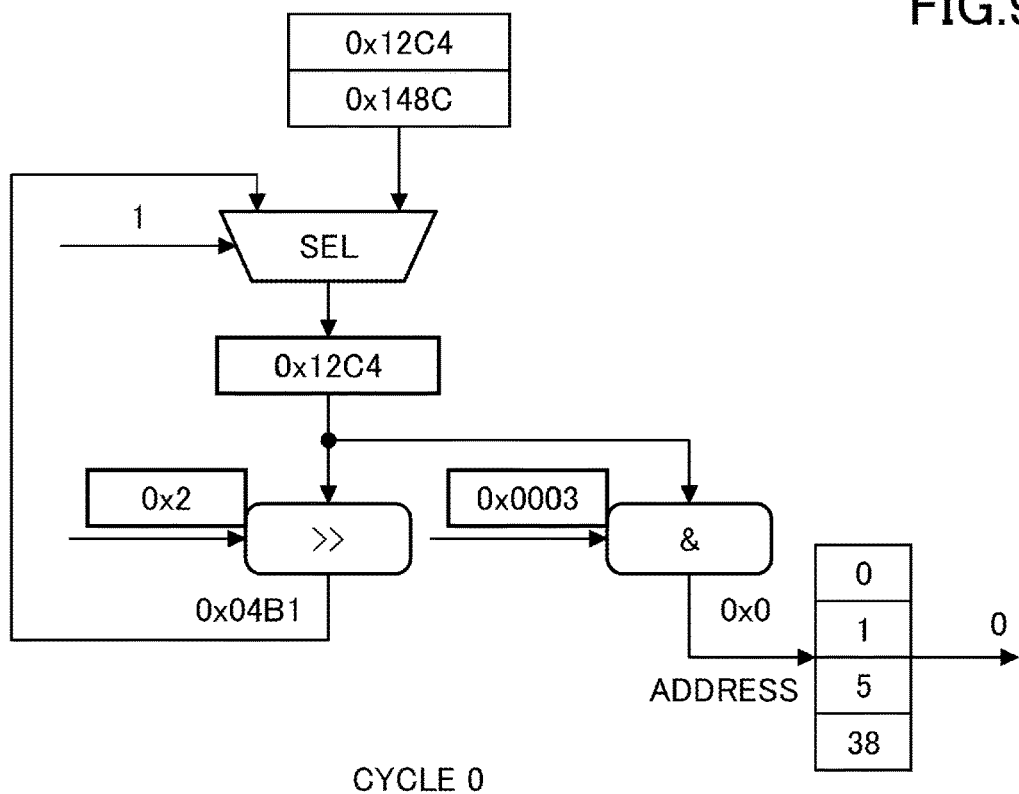
FIG. 9 is a schematic circuit diagram of the exemplary circuit device at cycle 0 according to one embodiment of the present disclosure.

At cycle 0, as illustrated in FIG. 9, when the selector SEL receives a "1" signal, the selector SEL selects the packed indices among incoming two inputs and supplies the first packed indices "0x12C4" to the index register INDEX REG. Then, the shift operation with the shift value "0x2" shifts the incoming "0x12C4" (="0x0001001011000100") by two digits and supplies the shifted result "0x04B1" (="0x0000010010110001") to the selector SEL. On the other hand, the mask operation with the mask value "0x0003" results in the ADDRESS signal "0x0" by masking the incoming "0x12C4" (="0x0001001011000100") with the mask value "0x0003" (="0x0000000000000011"), and the value "0" corresponding to storage location "0x0" is outputted as the first element in the restored data.

Figure 10:
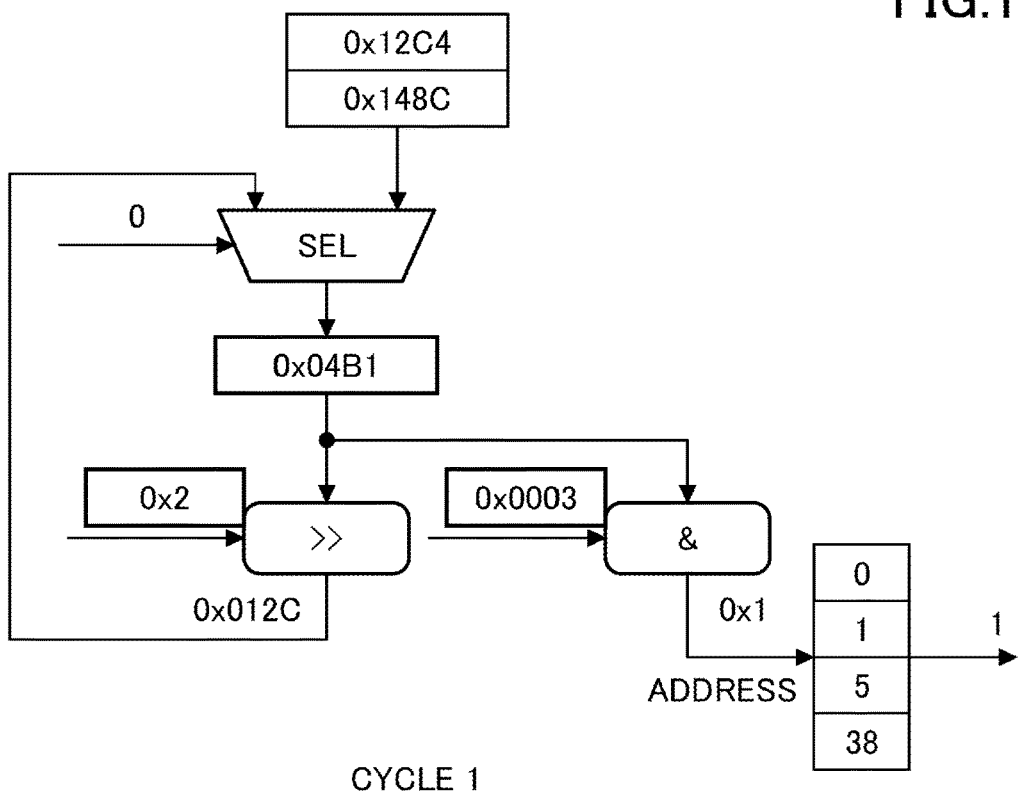
FIG. 10 is a schematic circuit diagram of the exemplary circuit device at cycle 1 according to one embodiment of the present disclosure.

At cycle 1, as illustrated in FIG. 10, when the selector SEL receives a "0" signal, the selector SEL selects the shifted result "0x04B1" among incoming two inputs and supplies the shifted result "0x04B1" to the index register INDEX REG. Then, the shift operation with the shift value "0x2" shifts the incoming "0x04B1" (="0x0000010010110001") by two digits and supplies the shifted result "0x012C" (="0x0000000100101100") to the selector SEL. On the other hand, the mask operation with the mask value "0x0003" results in the ADDRESS signal "0x1" by masking the incoming "0x04B1" (="0x0000010010110001") with the mask value "0x0003" (="0x00000000000011"), and the value "1" corresponding to storage location "0x1" is outputted as the second element in the restored data.

Figure 11:
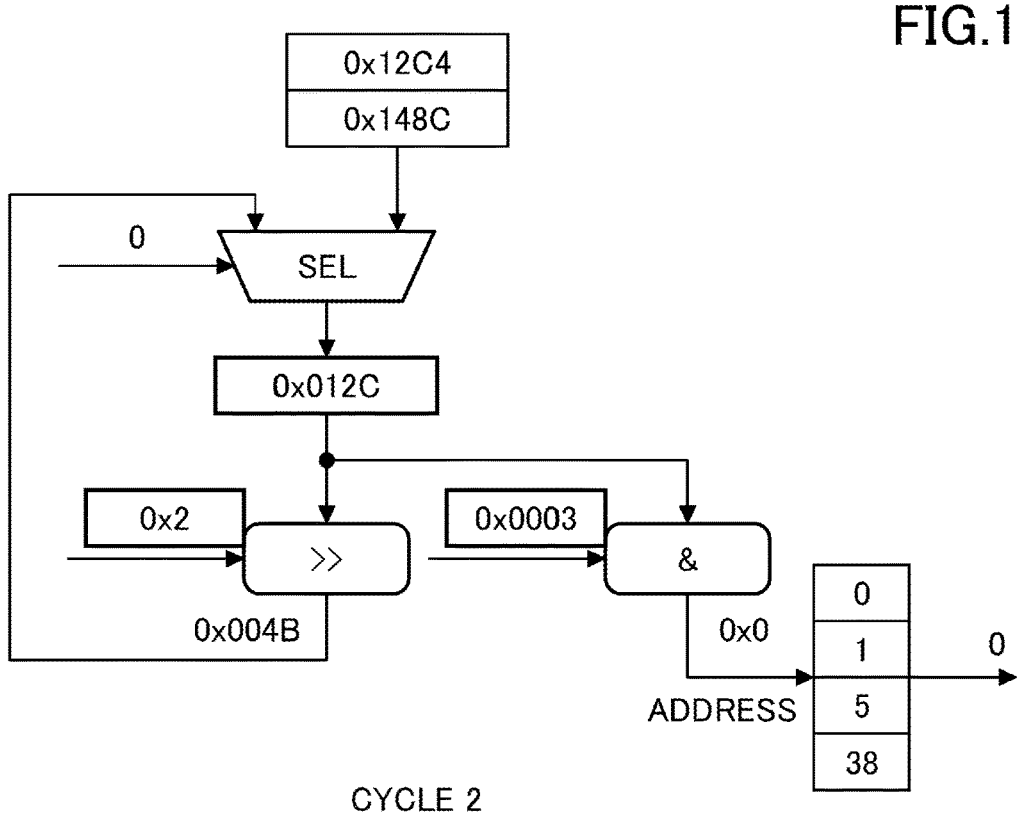
FIG. 11 is a schematic circuit diagram of the exemplary circuit device at cycle 2 according to one embodiment of the present disclosure.

At cycle 2, as illustrated in FIG. 11, when the selector SEL receives a "0" signal, the selector SEL selects the shifted result "0x012C" among incoming two inputs and supplies the shifted result "0x012C" to the index register INDEX REG. Then, the shift operation with the shift value "0x2" shifts the incoming "0x012C" (="0x0000000100101100") by two digits and supplies the shifted result "0x004B" (="0x0000000001001011") to the selector SEL. On the other hand, the mask operation with the mask value "0x0003" results in the ADDRESS signal "0x0" by masking the incoming "0x012C" (="0x0000000100101100") with the mask value "0x0003" (="0x00000000000011"), and the value "0" corresponding to storage location "0x0" is outputted as the third element in the restored data.

Figure 12:
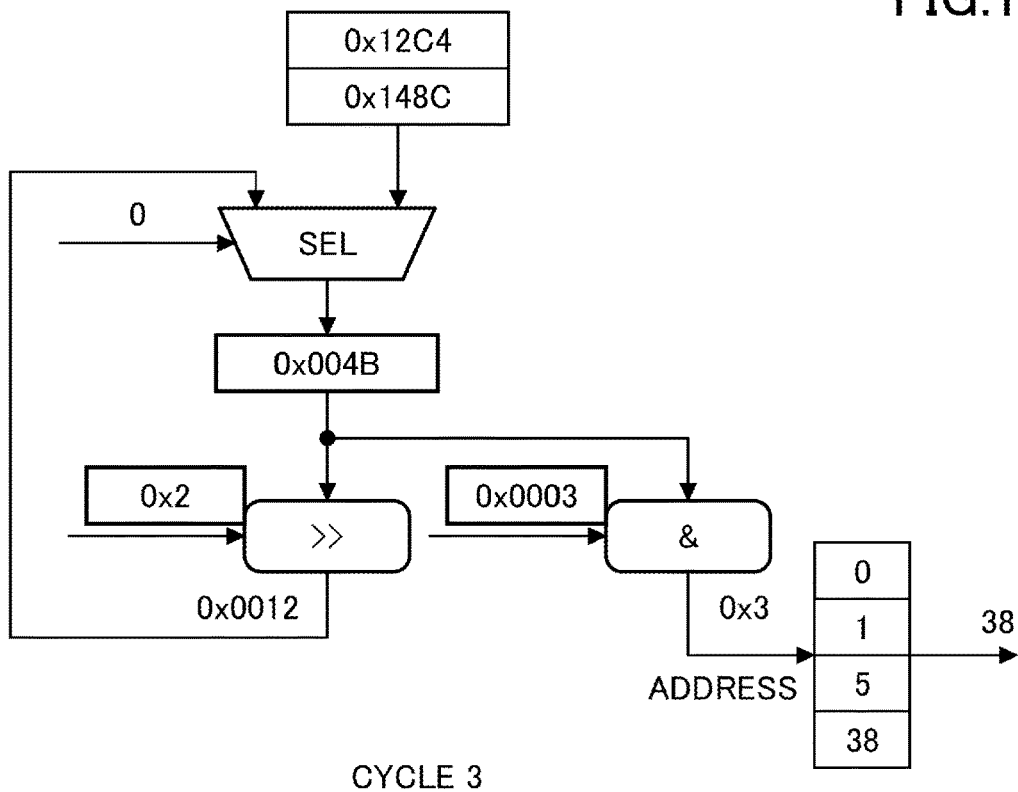
FIG. 12 is a schematic circuit diagram of the exemplary circuit device at cycle 3 according to one embodiment of the present disclosure.

At cycle 3, as illustrated in FIG. 12, when the selector SEL receives a "0" signal, the selector SEL selects the shifted result "0x004B" among incoming two inputs and supplies the shifted result "0x004B" to the index register INDEX REG. Then, the shift operation with the shift value "0x2" shifts the incoming "0x004B" (="0x0000000001001011") by two digits and supplies the shifted result "0x0012" (="0x0000000000010010") to the selector SEL. On the other hand, the mask operation with the mask value "0x0003" results in the ADDRESS signal "0x0" by masking the incoming "0x004B" (="0x0000000001001011") with the mask value "0x0003" (="0x00000000000011"), and the value "38" corresponding to storage location "0x3" is outputted as the fourth element in the restored data.

Figure 13:
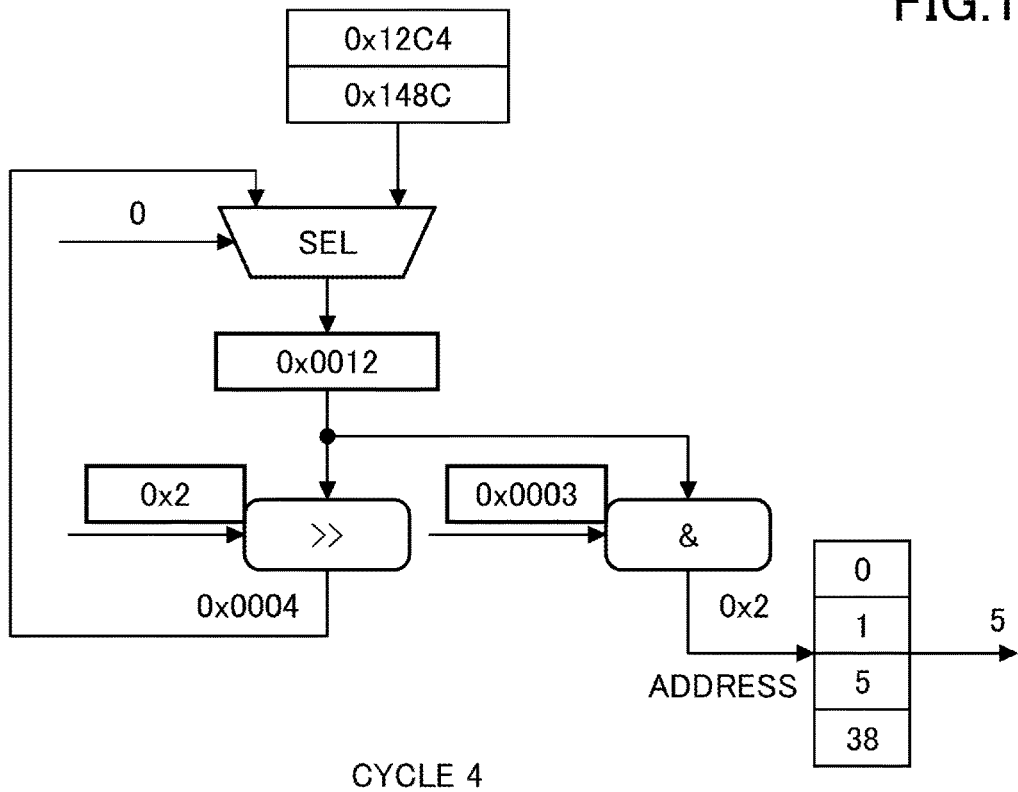
FIG. 13 is a schematic circuit diagram of the exemplary circuit device at cycle 4 according to one embodiment of the present disclosure.

At cycle 4, as illustrated in FIG. 13, when the selector SEL receives a "0" signal, the selector SEL selects the shifted result "0x0012" among incoming two inputs and supplies the shifted result "0x0012" to the index register INDEX REG. Then, the shift operation with the shift value "0x2" shifts the incoming "0x0012" (="0x0000000000010010") by two digits and supplies the shifted result "0x0004" (="0x0000000000000100") to the selector SEL. On the other hand, the mask operation with the mask value "0x0003" results in the ADDRESS signal "0x0" by masking the incoming "0x0012" (="0x0000000000010010") with the mask value "0x0003" (="0x00000000000011"), and the value "5" corresponding to storage location "0x2" is outputted as the fifth element in the restored data.

Figure 14:
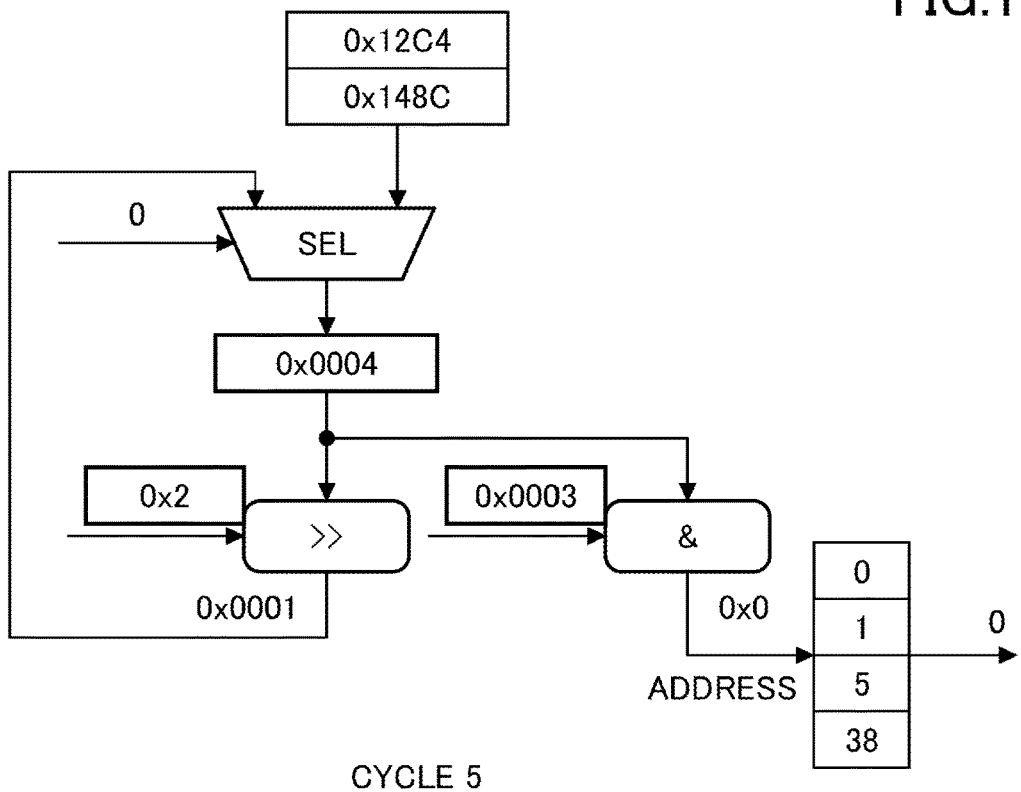
FIG. 14 is a schematic circuit diagram of the exemplary circuit device at cycle 5 according to one embodiment of the present disclosure.

At cycle 5, as illustrated in FIG. 14, when the selector SEL receives a "0" signal, the selector SEL selects the shifted result "0x0004" among incoming two inputs and supplies the shifted result "0x0004" to the index register INDEX REG. Then, the shift operation with the shift value "0x2" shifts the incoming "0x0004" (="0x0000000000000100") by two digits and supplies the shifted result "0x0001" (="0x0000000000000001") to the selector SEL. On the other hand, the mask operation with the mask value "0x0003" results in the ADDRESS signal "0x0" by masking the incoming "0x0004" (="0x0000000000000100") with the mask value "0x0003" (="0x00000000000011"), and the value "0" corresponding to storage location "0x0" is outputted as the sixth element in the restored data.

Figure 15:
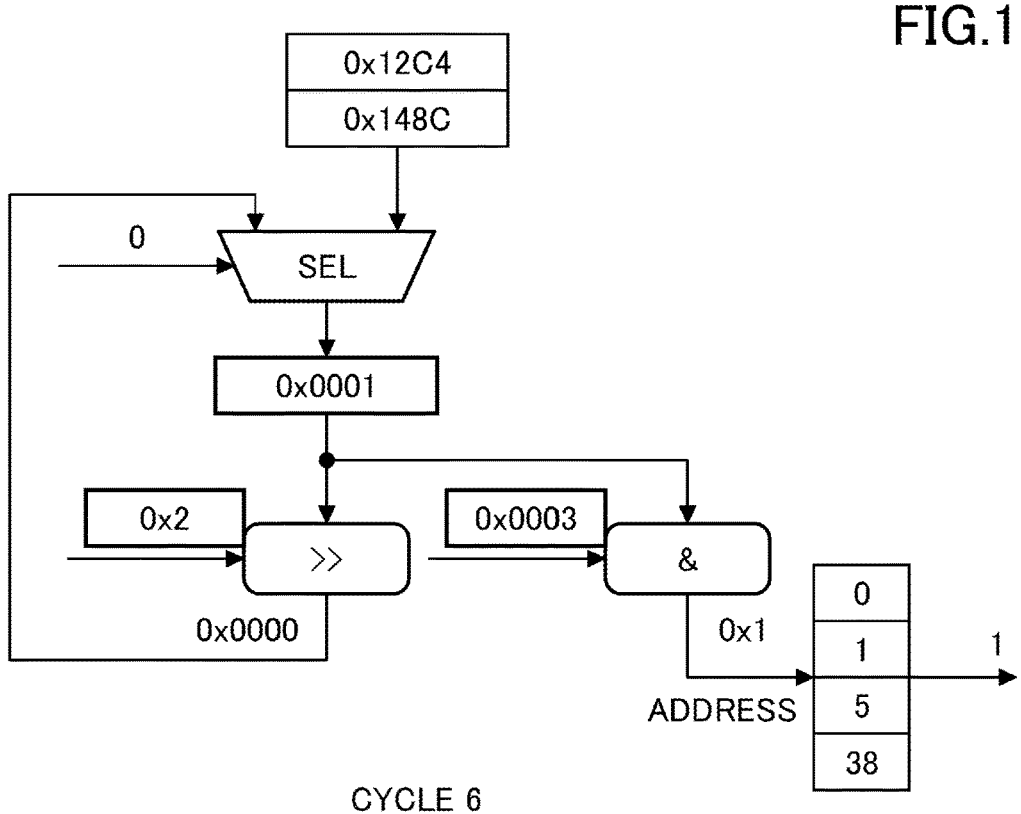
FIG. 15 is a schematic circuit diagram of the exemplary circuit device at cycle 6 according to one embodiment of the present disclosure.

At cycle 6, as illustrated in FIG. 15, when the selector SEL receives a "0" signal, the selector SEL selects the shifted result "0x0001" among incoming two inputs and supplies the shifted result "0x0001" to the index register INDEX REG. Then, the shift operation with the shift value "0x2" shifts the incoming "0x0001" (="0x0000000000000001") by two digits and supplies the shifted result "0x0000" (="0x0000000000000000") to the selector SEL. On the other hand, the mask operation with the mask value "0x0003" results in the ADDRESS signal "0x0" by masking the incoming "0x0001" (="0x0000000000000001") with the mask value "0x0003" (="0x00000000000011"), and the value "1" corresponding to storage location "0x1" is outputted as the seventh element in the restored data.

Figure 16:
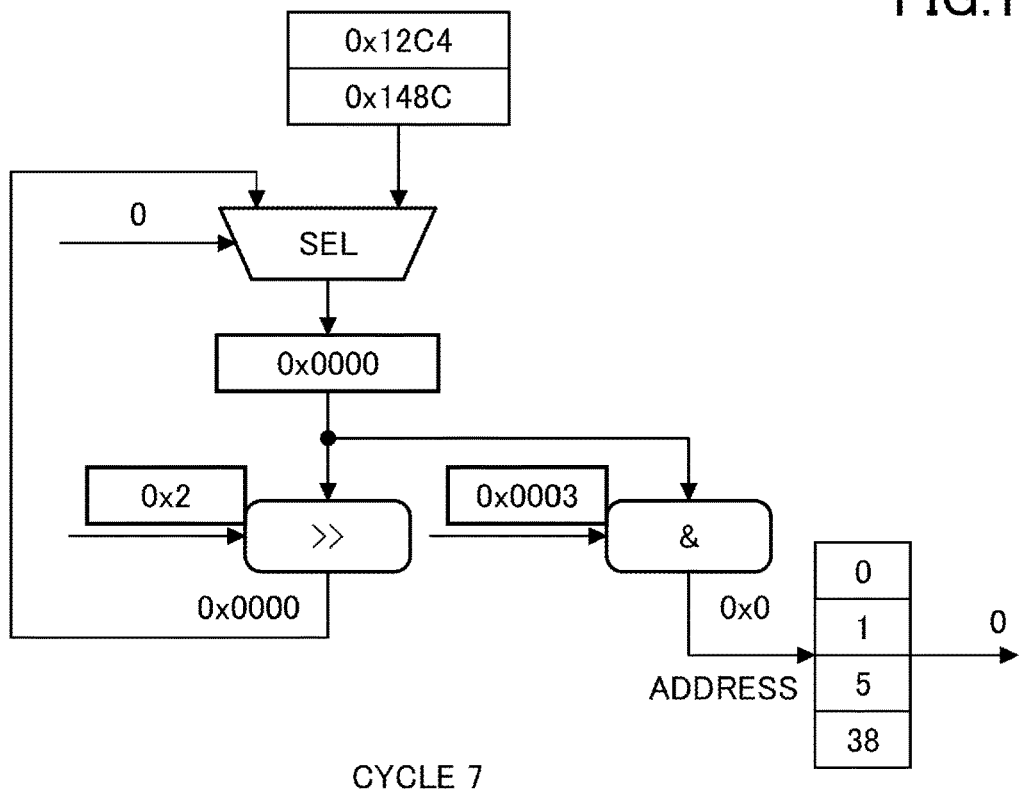
FIG. 16 is a schematic circuit diagram of the exemplary circuit device at cycle 7 according to one embodiment of the present disclosure.

At cycle 7, as illustrated in FIG. 16, when the selector SEL receives a "0" signal, the selector SEL selects the shifted result "0x0000" among incoming two inputs and supplies the shifted result "0x0000" to the index register INDEX REG. Then, the shift operation with the shift value "0x2" shifts the incoming "0x0000" (="0x0000000000000000") by two digits and supplies the shifted result "0x0000" (="0x0000000000000000") to the selector SEL. On the other hand, the mask operation with the mask value "0x0003" results in the ADDRESS signal "0x0" by masking the incoming "0x0000" (="0x0000000000000000") with the mask value "0x0003" (="0x00000000000011"), and the value "0" corresponding to storage location "0x0" is outputted as the eighth element in the restored data.

In this manner, the data restoration unit 220 can restore the first half of incoming data "0", "1", "0", "38", "5", "0", "1", "0" corresponding to the first sequence of packed indices "0x12C4".

Figure 17:
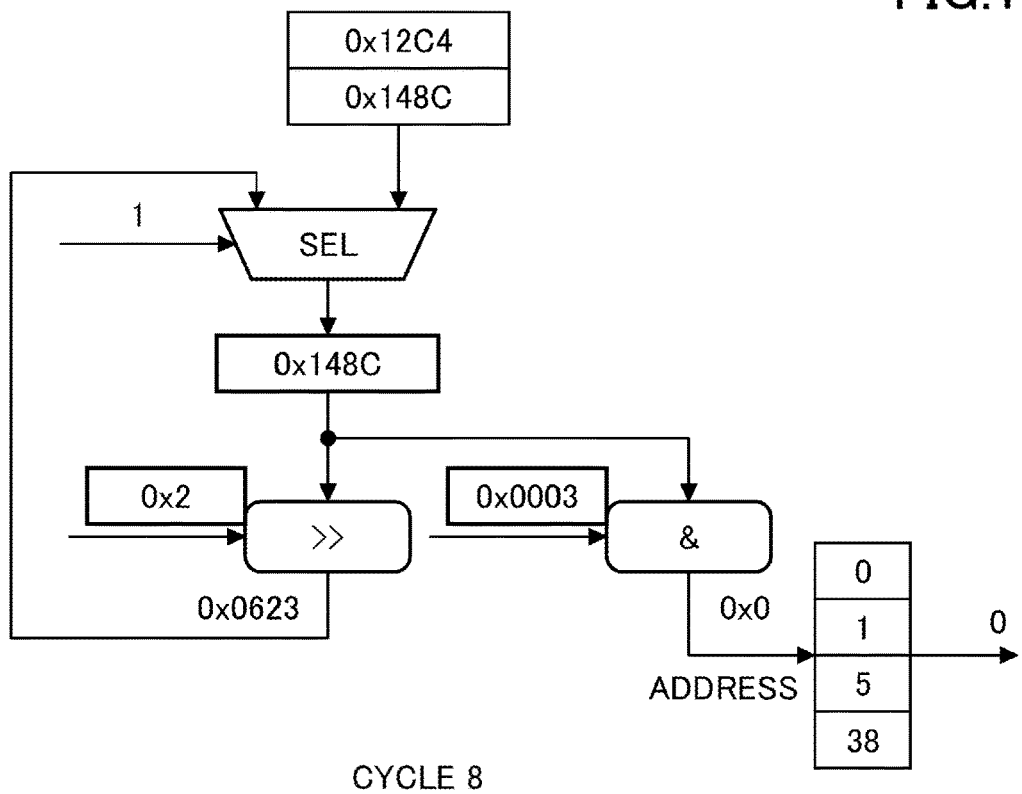
FIG. 17 is a schematic circuit diagram of the exemplary circuit device at cycle 8 according to one embodiment of the present disclosure.

At cycle 8, as illustrated in FIG. 17, when the selector SEL receives a "1" signal, the selector SEL selects another sequence of packed indices "0x148C" among incoming two inputs and supplies the packed indices "0x148C" to the index register INDEX REG. Then, the shift operation with the shift value "0x2" shifts the incoming "0x148" (="0x0001010010001100") by two digits and supplies the shifted result "0x0623" (="0x0000010100100011") to the selector SEL. On the other hand, the mask operation with the mask value "0x0003" results in the ADDRESS signal "0x0" by masking the incoming "0x148" (="0x0001010010001100") with the mask value "0x0003" (="0x00000000000011"), and the value "0" corresponding to storage location "0x0" is outputted as the ninth element in the restored data.

Through completion of similar operations on the whole index data, the data restoration unit 220 can restore the incoming data "0", "1", "0", "38", "5", "0", "1", "0" "0", "38", "0", "5", "0", "1", "1", "0" from the index data. In this fashion, the data decompression apparatus 200 can restore the incoming data from the compressed data and the index data generated by the data compression apparatus 100 in a lossless manner.

Variations

Next, several variations of the circuit device in the data decompression apparatus 200 are described with reference to FIGS. 18 to 20.

Figure 18:
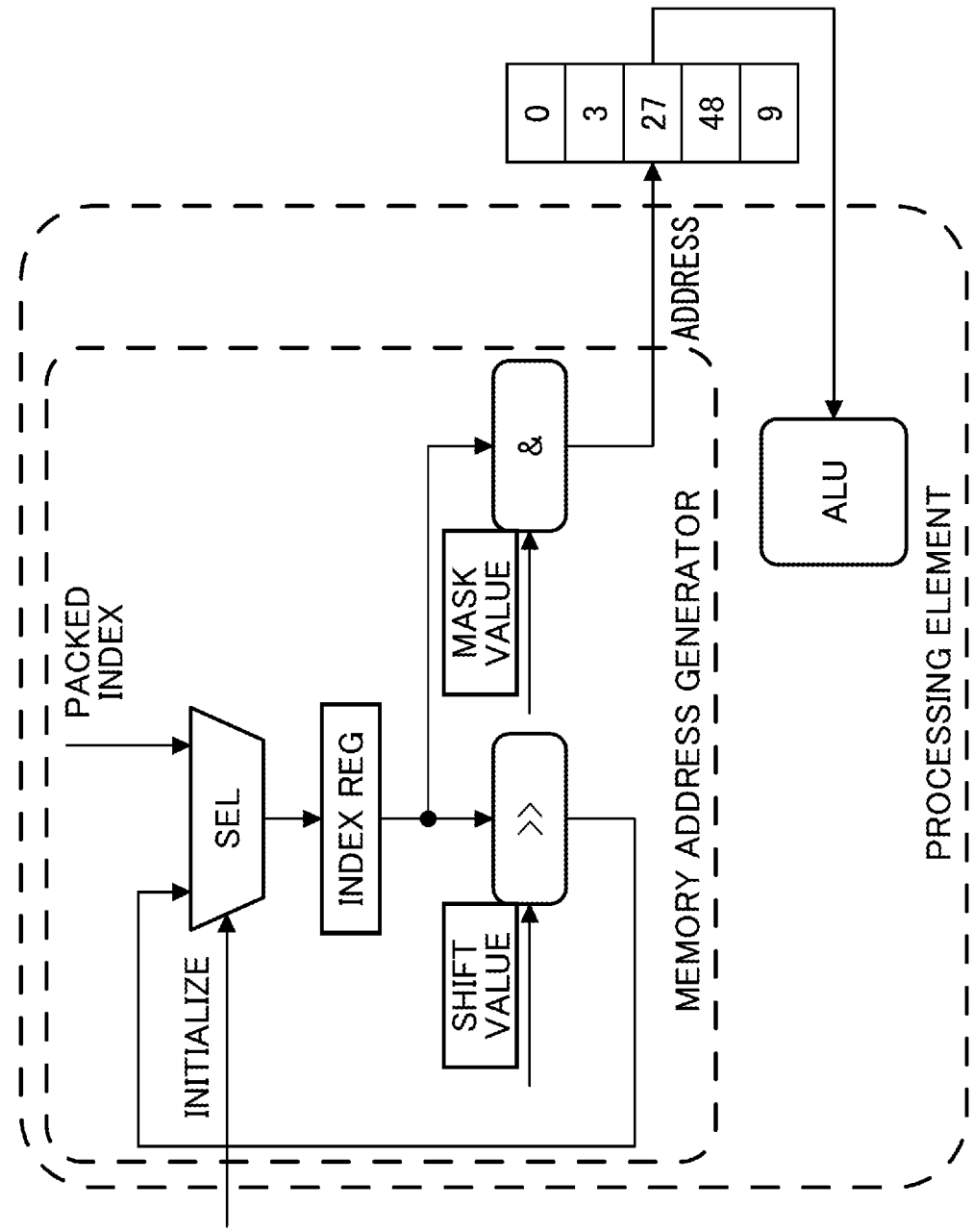
FIG. 18 is a schematic circuit diagram of one exemplary circuit device that implements data decompression with a single processing element according to one embodiment of the present disclosure.

In one variation, as illustrated in FIG. 18, the circuit device in the data decompression apparatus 200 may be arranged to include a single memory address generator as stated above and a single processing element ALU. According to this variation, the single memory address generator may restore respective elements in incoming data from the index data one-by-one, and the single processing element ALU may perform some operations on the elements sequentially provided from the memory address generator.

Figure 19:
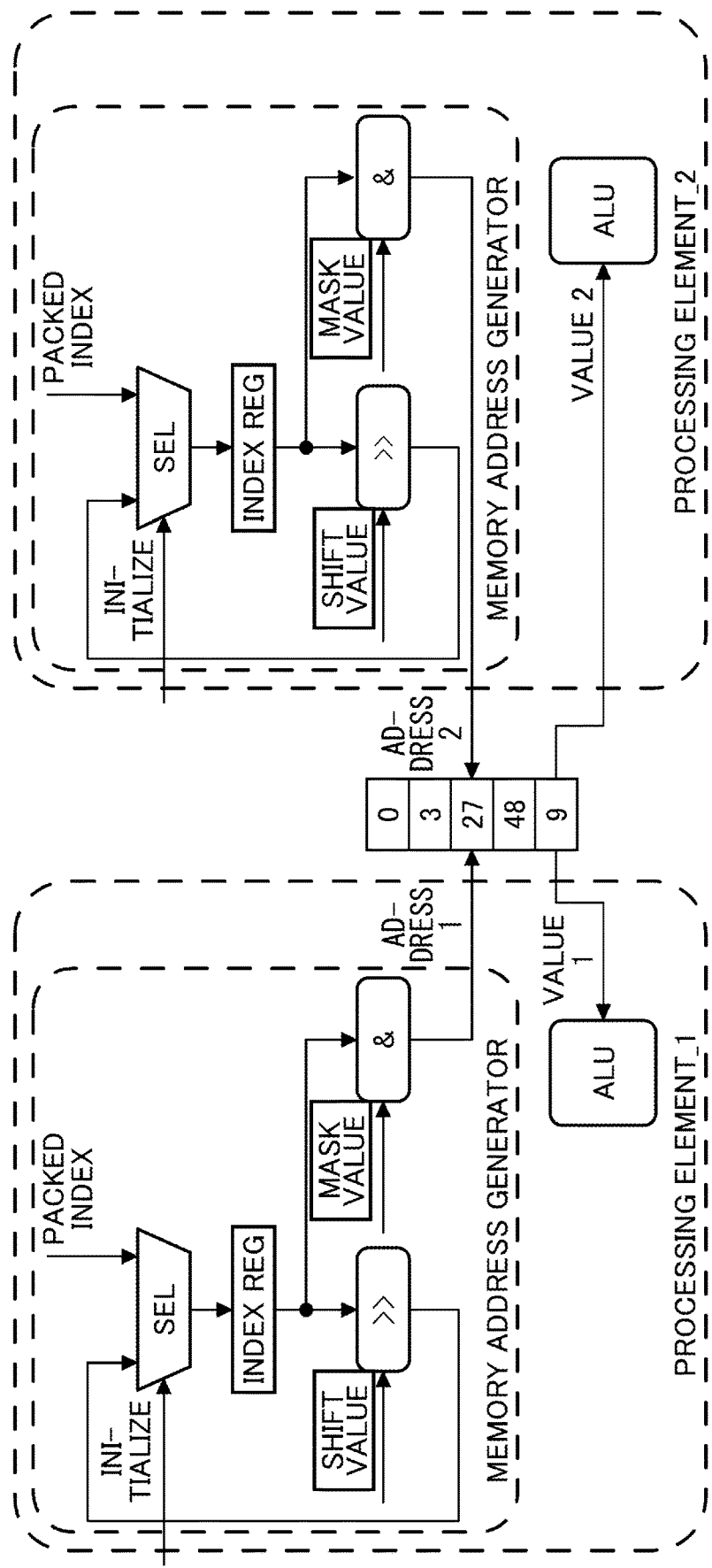
FIG. 19 is a schematic circuit diagram of one exemplary circuit device that implements data decompression with two processing elements according to one embodiment of the present disclosure.

In a further variation, as illustrated in FIG. 19, the circuit device in the data decompression apparatus 200 may be arranged to include two memory address generators and two processing elements ALUs. According to this variation, the two memory address generators may restore respective elements in incoming data from the index data in parallel, and the two processing elements ALUs may also perform some operations on the elements provided from the memory address generators in parallel, which can achieve the operations more promptly.

Figure 20:
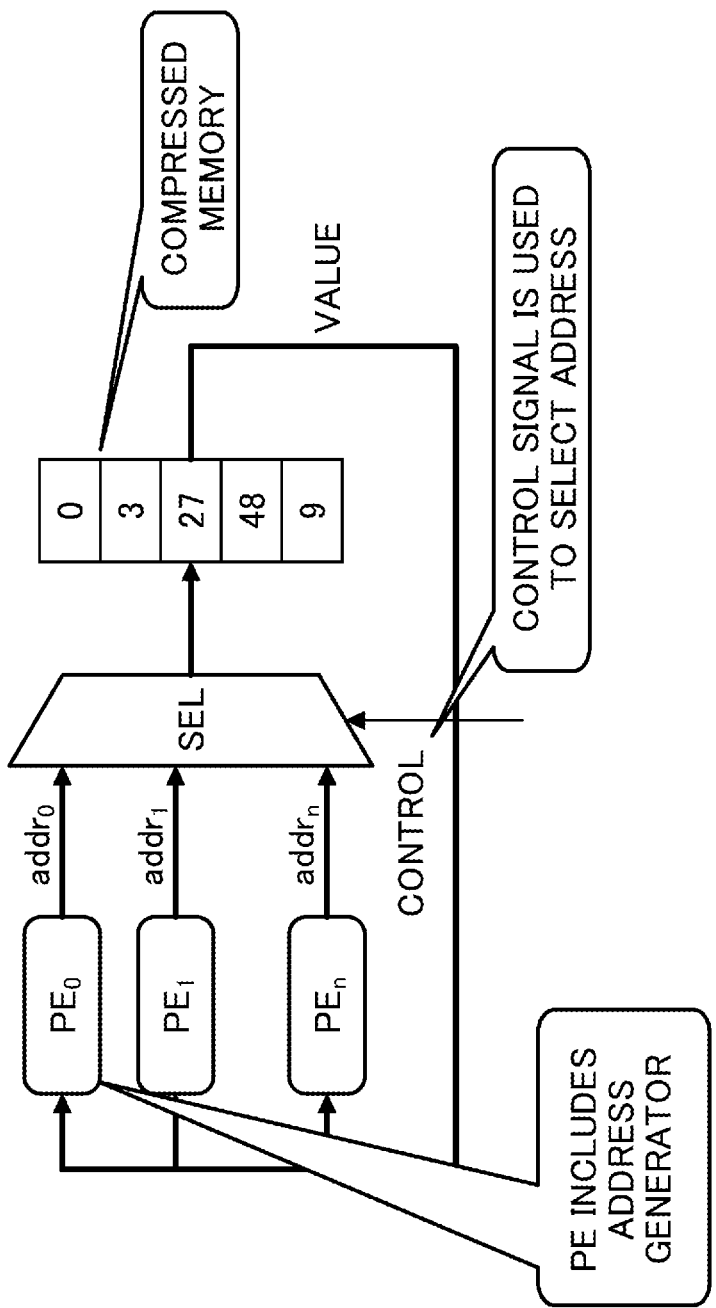
FIG. 20 is a schematic circuit diagram of one exemplary circuit device that implements data decompression with multiple processing elements according to one embodiment of the present disclosure.

In a still further variation, as illustrated in FIG. 20, the circuit device in the data decompression apparatus 200 may be arranged to include n memory address generators and n processing elements ALUs. According to this variation, the n memory address generators may restore respective elements in incoming data from the index data in parallel, and the n processing elements ALUs may also perform some operations on the elements provided from the memory address generators in parallel, which can achieve the operations much more promptly.

Data Storage Operation

Figure 21:
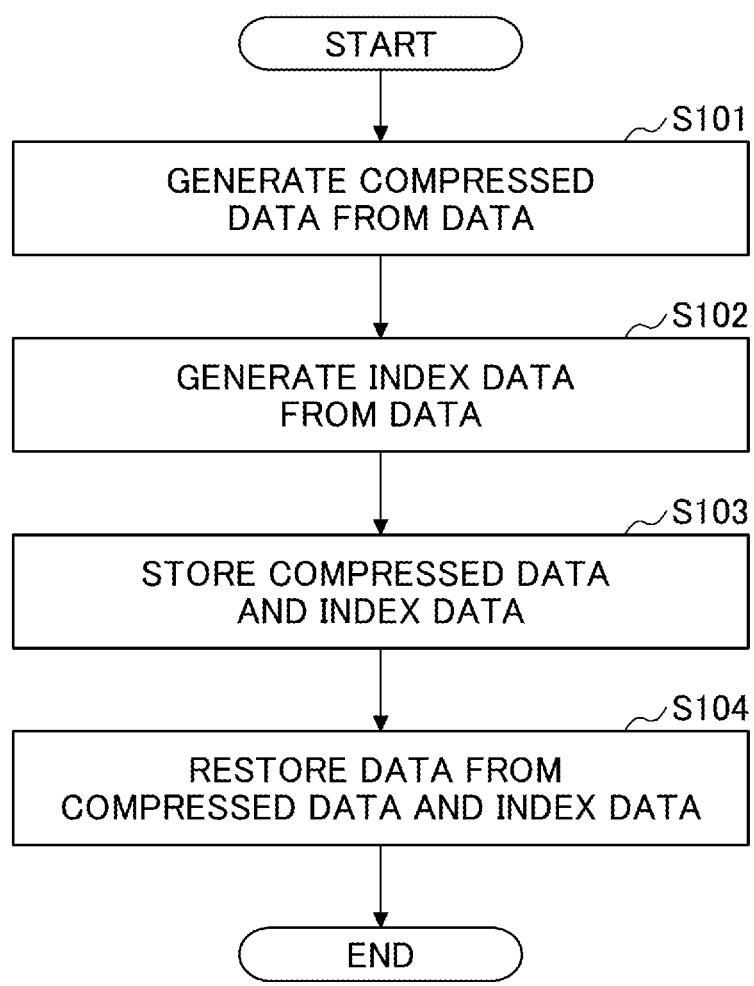
FIG. 21 is a flowchart that depicts one exemplary data compression and decompression operation according to one embodiment of the present disclosure.

Next, a data storage operation according to one embodiment of the present disclosure is described with reference to FIGS. 21 and 22. FIG. 21 is a flowchart of a data storage operation according to one embodiment of the present disclosure. The data storage operation may be executed by the data compression apparatus 100 and the data decompression apparatus 200 in the data storage system 10, particularly by one or more processors in the data compression apparatus 100 and the data decompression apparatus 200.

As illustrated in FIG. 21, at step S101, upon receiving incoming data, the data compression apparatus 100 generates compressed data from the incoming data. Specifically, the data compression apparatus 100 detects one or more duplicated or redundant values in the incoming data and generates the compressed data from the data by excluding or ignoring the detected duplicated or redundant values.

At step S102, the data compression apparatus 100 generates index data from the incoming data. Specifically, the data compression apparatus 100 determines at which storage locations in the compressed memory values of respective elements in the incoming data are stored and generates the index data from indices indicative of the determined storage locations.

At step S103, the data compression apparatus 100 stores the compressed data and the index data in the storage device 150. Specifically, the compressed data and the index data may be stored in a compressed memory and an index memory, respectively, in the storage device 150.

At step S104, upon receiving a request for the incoming data, the data decompression apparatus 200 accesses the compressed data in the compressed memory and the index data in the index memory in the storage device 150 and restores the incoming data from the compressed data and the index data. Specifically, the data decompression apparatus 200 identifies indices for respective elements in the index memory and determines values stored in storage locations in the compressed memory corresponding to the identified indices.

Figure 22:
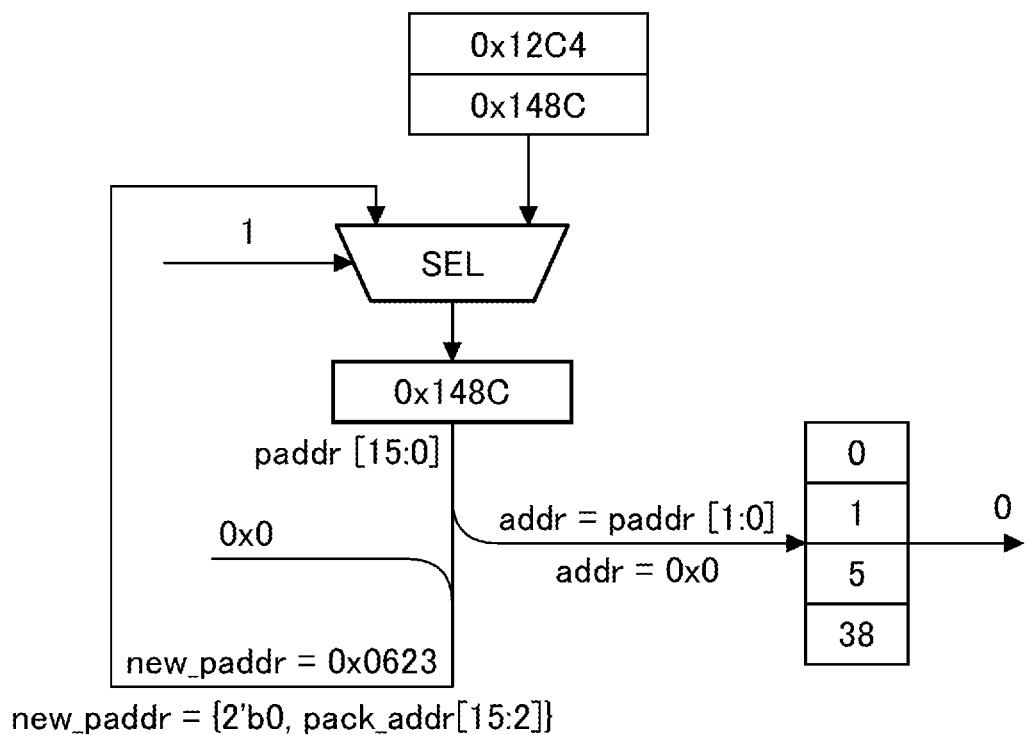
FIG. 22 is a schematic circuit diagram of one exemplary circuit device that implements data decompression according to one embodiment of the present disclosure.

For example, the data decompression apparatus 200 uses a circuit device as illustrated in FIG. 22 to restore values in respective elements in the incoming data from the packed indices.

Hardware Arrangement of Data Compression Apparatus and Data Decompression Apparatus In the data compression apparatus 100 and the data decompression apparatus 200 of the embodiments, respective functions may be implemented in a circuit that is formed of an analog circuit, a digital circuit or an analog-digital mixture circuit. Also, a control circuit for controlling the respective functions may be provided. The circuits may be implemented in an ASIC (Application Specific Integrated Circuit), a FPGA (Field Programmable Gate Array) or the like.

In all the above-stated embodiments, at least a part of the data compression apparatus 100 and the data decompression apparatus 200 may be arranged with hardware items. Also, if they are arranged with software items, a CPU (Central Processing Unit) or the like may implement them through information processing of the software items. In the case where they are arranged with software items, programs for implementing the data compression apparatus 100 and the data decompression apparatus 200 and functions of at least a portion thereof are stored in a storage medium and may be loaded into a computer for execution. The storage medium is not limited to a removable storage medium such as a magnetic disk (for example, a flexible disk) or an optical disk (for example, a CD-ROM or a DVD-ROM) and may be a fixed type of storage medium such as a SSD (Solid State Drive) using a hard disk device or a memory device. In other words, the information processing with software items may be some specific implementations using hardware resources. In addition, processing with software items may be implemented in a circuit such as a FPGA and may be executed with hardware resources. Jobs may be executed by using an accelerator such as a GPU (Graphics Processing Unit), for example.

For example, by a computer reading dedicated software items stored in a computer-readable storage medium, the computer can be embodied as the above implementations. The type of storage medium is not limited to any specific one. By installing the dedicated software items downloaded via a communication network into a computer, the computer can serve as the above implementations. In this manner, information processing with the software items can be concretely implemented with hardware resources.

Figure 23:
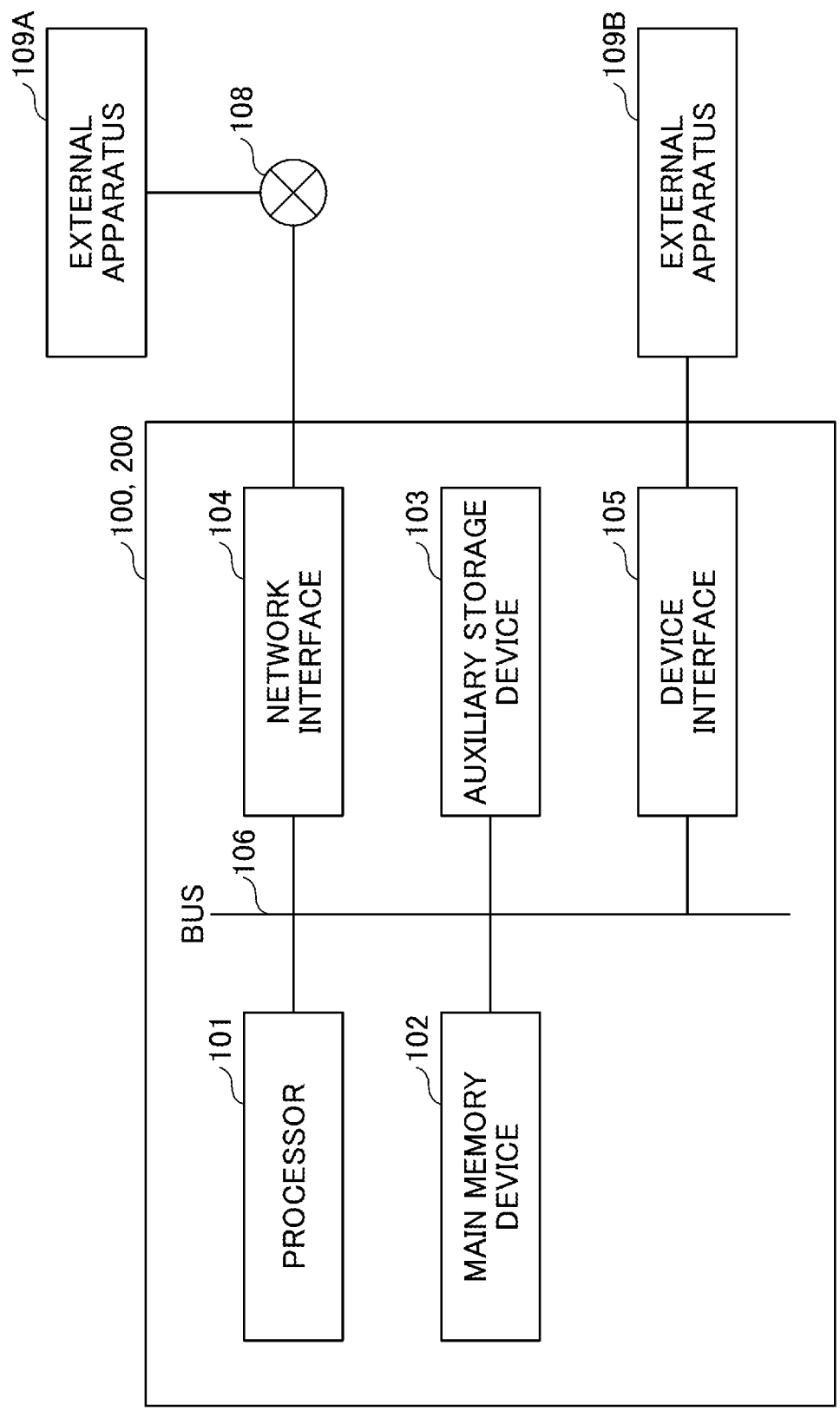
FIG. 23 is a block diagram that depicts a hardware arrangement of a data compression apparatus and a data decompression apparatus according to one embodiment of the present disclosure.

FIG. 23 is a block diagram for illustrating one exemplary hardware arrangement of the data compression apparatus 100 and the data decompression apparatus 200 according to one embodiment of the present disclosure. Each of the data compression apparatus 100 and the data decompression apparatus 200 can be implemented as a computing device including a processor 101, a main memory device 102, an auxiliary storage device 103, a network interface 104 and a device interface 105, which are coupled via a bus 106.

Note that each of the data compression apparatus 100 and the data decompression apparatus 200 in FIG. 23 includes respective components singly, but the same component may be plurally provided. Also, although the data compression apparatus 100 and the data decompression apparatus 200 are singly illustrated, software items may be installed in multiple computers, and each of the data compression apparatus 100 and the data decompression apparatus 200 may perform different portions of software operations. In this case, each of the multiple data compression apparatuses 100 and the multiple data decompression apparatuses 200 may communicate with each other via the network interface 104 or the like.

The processor 101 is an electronic circuit (a processing circuit or a processing circuitry) including a controller and an arithmetic unit of the data compression apparatus 100 and the data decompression apparatus 200. The processor 101 performs arithmetic operations based on incoming data and programs from respective internal devices in the data compression apparatus 100 and the data decompression apparatus 200 and supplies operation results and control signals to the respective internal devices or the like. Specifically, the processor 101 runs operating systems (OS), applications or the like in the data compression apparatus 100 and the data decompression apparatus 200 to control respective components of the data compression apparatus 100 and the data decompression apparatus 200. The processor 101 is not particularly limited to any certain one and may be any other implementation that can perform the above operations. The data compression apparatus 100, the data decompression apparatus 200 and respective components thereof may be implemented with the processor 101. Here, the processing circuit may be one or more electric circuits disposed on a single chip or on two or more chips or devices. If the multiple electronic circuits are used, the respective electronic circuits may communicate with each other in a wired or wireless manner.

The main memory device 102 is a memory device for storing various data and instructions for execution by the processor 101, and information stored in the main memory device 102 is directly read by the processor 101. The auxiliary storage device 103 includes storage devices other than the main memory device 102. Note that the memory device and the storage device mean arbitrary electronic parts capable of storing electronic information and may serve as memories or storages. Also, the memory device may be any of a volatile memory and a non-volatile memory. The memory device for storing various data in the data compression apparatus 100 and the data decompression apparatus 200 may be implemented with the main memory device 102 or the auxiliary storage device 103, for example. As one example, at least a portion of the memory device may be implemented in the main memory device 102 or the auxiliary storage device 103. As another example, if an accelerator is provided, at least a portion of the above-stated memory device may be implemented in memory device within the accelerator.

The network interface 104 is an interface for connecting to the communication network 108 in a wired or wireless manner. The network interface 104 may be compliant with any of existing communication standards. Information may be exchanged with the external apparatus 109A communicatively coupled via the communication network 108.

The external apparatus 109A may include a camera, a motion capture, an output device, an external sensor, an input device and so on, for example. Also, the external apparatus 109A may be an apparatus having a part of functions of components in the data compression apparatus 100 and the data decompression apparatus 200. Then, the data compression apparatus 100 and the data decompression apparatus 200 may receive a part of processing results of the data compression apparatus 100 and the data decompression apparatus 200 via the communication network 108 as in cloud services.

The device interface 105 is an interface such as a USB (Universal Serial Bus) directly coupled with the external apparatus 109B. The external apparatus 109B may be an external storage medium or a storage device. The memory device may be implemented with the external apparatus 109B.

The external apparatus 109B may be an output device. The output device may be a display device for displaying images or an output device for sounds or the like, for example. For example, the output device may be, but not limited to, a LCD (Liquid Crystal Display), a CRT (Cathode Ray Tube), a PDP (Plasma Display Panel), an organic EL (ElectroLuminescence) display, a speaker or the like.

Note that the external apparatus 109B may be an input device. The input device may include a device such as a keyboard, a mouse, a touch panel, a microphone or the like, and incoming information from these devices is provided to the data compression apparatus 100 and the data decompression apparatus 200. Signals from the input device are supplied to the processor 101.

For example, the compressed data generation unit 110, the index data generation unit 120, the data acquisition unit 210 and the data restoration unit 220 or the like in the data compression apparatus 100 and the data decompression apparatus 200 according to the present embodiments may be implemented with one or more processors 101. Also, memory devices in the data compression apparatus 100 and the data decompression apparatus 200 may be implemented with the main memory device 102 or the auxiliary storage device 103. Also, the data compression apparatus 100 and the data decompression apparatus 200 may include one or more memory devices.

In the specification, the representation "at least one of a, b and c" may include not only combinations a, b, c, a-b, a-c, b-c and a-b-c but also combinations of a plurality of the same elements a-a, a-b-b, a-a-b-b-c-c or the like. Also, the representation may cover arrangements including elements other than a, b and c such as the combination a-b-c-d.

Similarly, in the specification, the representation "at least one of a, b or c" may include not only combinations a, b, c, a-b, a-c, b-c and a-b-c but also combinations of a plurality of the same elements a-a, a-b-b, a-a-b-b-c-c or the like. Also, the representation may cover arrangements including elements other than a, b and c such as the combination a-b-c-d.

Although certain embodiments of the present disclosure have been described in detail, the present disclosure is not limited to the above-stated certain embodiments, and various modifications can be made within the spirit of the present disclosure as defined by claims.

What is claimed is:

1. A data processing method comprising:
    acquiring, by one or more processors, compressed data generated from data, wherein values of the compressed data are stored at first storage locations;
    acquiring, by the one or more processors, index data includes indices indicative of the first storage locations;
    acquiring, by the one or more processors, at least two packed indices generated from the index data, each of the at least two packed indices having a same number of storage locations, and each of the storage locations indicating one of the first storage locations; and
    inputting, by the one or more processors, the at least two packed indices into at least two selectors respectively.

2. The data processing method as claimed in claim 1, wherein the at least two packed indices are inputted into the at least two selectors in parallel.

3. The data processing method as claimed in claim 1, wherein the selected values in the first storage locations are unduplicated.

4. The data processing method as claimed in claim 1, wherein the at least two packed indices are generated by dividing a part of the index data.

5. The data processing method as claimed in claim 1, wherein values of the data are stored at second storage locations, and a size of the first storage locations is smaller than that of the second storage locations.

6. The data processing method as claimed in claim 1, wherein values of the data are stored at second storage locations, and all the values in the first storage locations are selected from the values in the second storage locations.

7. The data processing method as claimed in claim 1, wherein the values in the first storage locations are sorted in an ascending order.

8. The data processing method as claimed in claim 1, wherein each of the at least two packed indices has a same size.

9. The data processing method as claimed in claim 1, wherein the data is restored by using the at least two packed indices and the compressed data.

10. The data processing method as claimed in claim 1, wherein the data is restored by shifting each of the at least two packed indices.

11. An apparatus comprising:
one or more memories; and
one or more processors configured to:
acquire compressed data generated from data, wherein values of the compressed data are stored at first storage locations;
acquire index data includes indices indicative of the first storage locations;
acquire at least two packed indices generated from the index data, each of the at least two packed indices having a same number of storage locations, and each of the storage locations indicating one of the first storage locations; and
input the at least two packed indices into at least two selectors respectively.

12. The apparatus as claimed in claim 11, wherein the at least two packed indices are inputted into the at least two selectors in parallel.

13. The apparatus as claimed in claim 11, wherein the selected values in the first storage locations are unduplicated.

14. The apparatus as claimed in claim 11, wherein the at least two packed indices are generated by dividing a part of the index data.

15. The apparatus as claimed in claim 11, wherein values of the data are stored at second storage locations, and a size of the first storage locations is smaller than that of the second storage locations.

16. The apparatus as claimed in claim 11, wherein values of the data are stored at second storage locations, and all the values in the first storage locations are selected from the values in the second storage locations.

17. The apparatus as claimed in claim 11, wherein the values in the first storage locations are sorted in an ascending order.

18. The apparatus as claimed in claim 11, wherein each of the at least two packed indices has a same size.

19. The apparatus as claimed in claim 11, wherein the data is restored by using the at least two packed indices and the compressed data.

20. A non-transitory recording medium having stored therein a program for causing at least one processor to execute a process comprising:
acquiring compressed data generated from data, wherein values of the compressed data are stored at first storage locations;
acquiring index data includes indices indicative of the first storage locations;
acquiring at least two packed indices generated from the index data. each of the at least two packed indices having a same number of storage locations, and each of the storage locations indicating one of the first storage locations; and
inputting the at least two packed indices into at least two selectors respectively.

* * * * *